(12) United States Patent
Ishikawa et al.

(10) Patent No.: US 8,124,312 B2
(45) Date of Patent: Feb. 28, 2012

(54) METHOD FOR FORMING PATTERN, AND MATERIAL FOR FORMING COATING FILM

(75) Inventors: Kiyoshi Ishikawa, Kanagawa (JP); Jun Koshiyama, Kanagawa (JP); Kazumasa Wakiya, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 272 days.

(21) Appl. No.: 12/443,118

(22) PCT Filed: Sep. 13, 2007

(86) PCT No.: PCT/JP2007/067886
§ 371 (c)(1),
(2), (4) Date: Mar. 26, 2009

(87) PCT Pub. No.: WO2008/038526
PCT Pub. Date: Apr. 3, 2008

(65) Prior Publication Data
US 2010/0035177 A1 Feb. 11, 2010

(30) Foreign Application Priority Data
Sep. 28, 2006 (JP) ................. 2006-265115

(51) Int. Cl.
*G03F 7/00* (2006.01)
*G03F 7/004* (2006.01)
*G03F 7/20* (2006.01)
*G03F 7/26* (2006.01)

(52) U.S. Cl. ........... 430/270.1; 430/312; 430/394; 430/396; 430/271.1; 430/273.1; 430/927

(58) Field of Classification Search ........ 430/270.1, 430/312, 394, 396, 271.1, 273.1, 927
See application file for complete search history.

(56) References Cited

U.S. PATENT DOCUMENTS
6,593,063 B1 * 7/2003 Tanaka et al. ............... 430/311
(Continued)

FOREIGN PATENT DOCUMENTS
JP H04-71222 3/1992
(Continued)

OTHER PUBLICATIONS

Takeaki Ebihara et al. "Beyond k1=0.25 lithography : 70nm L/S patterning using KrF scanners", Proceedings of SPIE, vol. 5256, p. 985-994, 2003.
(Continued)

*Primary Examiner* — Amanda C. Walke
(74) *Attorney, Agent, or Firm* — Hoffmann & Baron, LLP

(57) ABSTRACT

A novel method for forming a pattern capable of decreasing the number of steps in a double patterning process, and a material for forming a coating film suitably used in the method for forming a pattern are provided. First resist film (2) is formed by applying a first chemically amplified resist composition on support (1), and thus formed film is selectively exposed, and developed to form multiple first resist patterns (3). Next, on the surface of the first resist patterns (3) are formed multiple coating patterns (5) by forming coating films (4) constituted with a water soluble resin film, respectively. Furthermore, a second chemically amplified resist composition is applied on the support (1) having the coating pattern (5) formed thereon to form second resist film (6), which is selectively exposed and developed to form multiple second resist patterns (7). Accordingly, a pattern including the coating patterns (5) and the second resist patterns (7) is formed on the support (1).

5 Claims, 2 Drawing Sheets

U.S. PATENT DOCUMENTS

| | | | |
|---|---|---|---|
| 7,235,438 B2 * | 6/2007 | Chung et al. | 438/198 |
| 7,255,967 B2 * | 8/2007 | Fujimori | 430/7 |
| 7,365,018 B2 * | 4/2008 | Higashitani et al. | 438/717 |
| 7,759,235 B2 * | 7/2010 | Zhuang et al. | 438/587 |
| 7,820,367 B2 * | 10/2010 | Kozawa et al. | 430/322 |
| 2005/0130069 A1 * | 6/2005 | Takizawa | 430/312 |
| 2009/0203224 A1 * | 8/2009 | Shih et al. | 438/780 |
| 2010/0090372 A1 * | 4/2010 | Ishikawa et al. | 264/342 R |

FOREIGN PATENT DOCUMENTS

| | | |
|---|---|---|
| JP | H06-326018 | 11/1994 |
| JP | H08-179107 | 7/1996 |
| JP | H09-205081 | 8/1997 |
| JP | 2003-241385 A | 8/2003 |
| JP | 2006-99059 A | 4/2006 |
| WO | 2005/098545 A1 | 10/2005 |

OTHER PUBLICATIONS

Yan Borodovsky, "Marching to the beat of Moore's Law", Proceedings of SPIE, vol. 6153, No. 615301-1-19, 2006.

Sungkoo Lee et al., "Double exposure technology using silicon containing materials", Proceedings of SPIE, vol. 6153, 61531K1-7, 2006.

International Search Report for PCT/JP2007/067886, Oct. 4, 2007.

* cited by examiner

METHOD FOR FORMING PATTERN, AND MATERIAL FOR FORMING COATING FILM

CROSS-REFERENCE TO RELATED APPLICATIONS

This application is the National Stage of International Application No. PCT/JP2007/067886, filed Sep. 13, 2007, which claims the benefit of Japanese Application No. 2006-265115, filed Sep. 28, 2006, the contents of which are incorporated by reference herein in their entirety.

FIELD OF THE INVENTION

The present invention relates to a method for forming a pattern in which a pattern is formed by a double patterning process, and a material for forming a coating film suitably used in the method for forming a pattern.

RELATED ART

Techniques in which a micropattern is formed on a substrate, which is employed as a mask to process the lower layer of the pattern by etching (pattern forming technique) have been extensively adopted in production of IC in semiconductor industry, and the like, and have attracted great attention.

Micropatterns are generally constituted with an organic material, and are formed by a technique such as a lithographic method or a nano-imprint method. For example, in the lithographic method, the steps of: forming a resist film constituted with a resist composition that contains a base material component such as a resin, on a support such as a substrate; selectively irradiating the resist film with a radiation such as an electron beam or light through a mask having a formed certain pattern (mask pattern); and subjecting to a developing treatment, whereby a resist pattern having a certain shape is formed on the resist film, are carried out. A resist composition that has a characteristic altered to be soluble in a developer at the exposed part is referred to as positive type, while a resist composition that has a characteristic altered to be insoluble in a developer at the exposed part is referred to as negative type. Then, a semiconductor element or the like is manufactured via a step of processing the substrate by etching, using the aforementioned resist pattern as a mask.

In recent years, miniaturization of patterns has rapidly advanced in accordance with progress of lithographic techniques. In procedures for miniaturization, shortening of the wavelength of the light source for exposure has been generally performed. Specifically, although an ultraviolet ray typified by g-ray or i-ray has been conventionally employed, mass production of semiconductor elements using a KrF excimer laser or an ArF excimer laser has been currently initiated. For example, lithography using an ArF excimer laser has enabled pattern formation with a resolving ability at a level of 45 nm. In addition, for further improving the resolving ability, $F_2$ excimer laser, electron beam, EUV (extreme ultraviolet ray) as well as X-ray and the like, with the wavelength being shorter than that of the excimer laser, have been also investigated.

Lithography characteristics such as sensitivity to these light sources for exposure, resolving ability to allow patterns of minute size to be reproduced, and the like are demanded for the resist composition. As a resist composition that meets such requirements, a chemically amplified resist composition containing a base material component having an alkaline solubility that will be altered by the action of an acid, and an acid generator that generates acid upon exposure has been used (see, Patent Document 1). For example, positive type chemically amplified resists usually contain, as a base material component, a resin having an alkaline solubility that increases by the action of an acid. Thus, in forming a resist pattern, when an acid is generated from an acid generator upon exposure, the exposed part becomes soluble in alkali.

As one of the procedures for further improving the resolving ability, a lithographic method, liquid immersion lithography generally referred to (hereinafter, may be also referred to as liquid immersion exposure), has been known in which exposure (immersion exposure) is carried out while allowing a liquid (liquid immersion medium) having a refractive index greater than that of the air to exist between the sample and an objective lens of the exposure device (see, Nonpatent Document 1).

Regarding liquid immersion exposure, it is reported that a high resolving ability similar to those exhibited in the case in which a light source with a shorter wavelength and in the case in which a high NA lens is used can be achieved even though a light source with the same exposure wavelength is used, and also reported that a decrease in the focal depth width is not found. Additionally, the liquid immersion exposure can be carried out through application of a preexisting exposure device. Therefore, the liquid immersion exposure is expected to be capable of realizing formation of a resist pattern with a high resolving ability and also with favorable focal depth width at low costs. Thus, it has drawn great attention owing to significant effects exerted on semiconductor industry in terms of costs, as well as lithography characteristics such as resolution, in manufacturing semiconductor elements which require a large amount of investment in equipment.

The liquid immersion exposure is efficacious in forming any pattern configuration, and further it is reportedly possible to use it in combination with a super-resolution technique currently being investigated such as a phase shift method, a modified illumination method or the like. At present, techniques in which an ArF excimer laser is employed as a light source have been mainly studied actively as the liquid immersion exposure technique. In addition, until now, water has been predominantly investigated as the liquid immersion medium.

Recently, as a newly proposed lithographic technique, there exists a double patterning process in which a pattern is formed by carrying out patterning more than once (see, Nonpatent Documents 2 and 3). According to this double patterning process, a finer pattern can be reportedly formed as compared with the pattern formed in the case of patterning carried out just once. For example, Nonpatent Document 2 discloses the method as shown in FIG. 2A to FIG. 2F.

Specifically, a laminate formed by lamination of substrate 101, lower layer film 102 and hard mask 103 is first provided as shown in FIG. 2A. Next, a resist film is provided on the hard mask 103, and the resist film is exposed selectively through mask 105 as shown in FIG. 2B, followed by development to form resist pattern 104 in which a plurality of trench patterns having a space width of d/4 are arranged with a pitch of d. Next, after etching of the hard mask 103 is carried out using the resist pattern 104 as a mask, the residual resist pattern 104 is removed. Thus, hard mask 103' having a transferred resist pattern as shown in FIG. 2C is obtained. Next, the position of the mask 105 is shifted as shown in FIG. 2D, and a resist material is applied on the hard mask 103', whereby a resist film that fills in the airspace in the hard mask 103' and has a film thickness greater than the thickness of the hard mask 103' is formed. Subsequently, the resist film is selectively exposed through the shifted mask 105, followed by development to form resist pattern 106. Next, after etching of the hard mask 103' is carried out using the resist pattern 106 as a mask, the residual resist pattern 106 is removed. Thus, hard mask 103" having a transferred resist pattern in which a plurality of trench patterns having a space width of d/4 are arranged with a pitch of d/2 as shown in FIG. 2E is obtained. Subsequently, the pattern of the hard mask 103" is transferred to the lower layer film 102 by carrying out etching using the hard mask 103" as a mask, whereby pattern 102' having a pitch ½ of the mask 105 employed is formed.

Thus, according to the double patterning process, a resist pattern with a higher resolving ability can be formed even though a light source with the same exposure wavelength is used, or even though the same resist composition is used. In addition, the double patterning process can be carried out using a preexisting exposure device.

Patent Document 1: Japanese Unexamined Patent Application, First Publication No. 2003-241385

Nonpatent Document 1: OPTRONICS No. 4 (2003)

Nonpatent Document 2: Proceedings of SPIE, Vol. 5256, pp. 985-994 (2003).

Nonpatent Document 3: Proceedings of SPIE Vol. 6153, No. 615301-1-19 (2006).

SUMMARY OF THE INVENTION

However, in the conventional double patterning process, it is necessary, in general, to provide a lower layer film on a substrate, and is also necessary to carry out patterning of a resist film at least twice and etching of the hard mask of the lower layer at least twice for forming a pattern on the substrate.

The present invention was made in view of the foregoing circumstances, and an object of the invention is to provide a novel method for forming a pattern which can reduce the number of steps in double patterning process, and a material for forming a coating film suitably used in the method for forming a pattern.

The present inventors have thoroughly investigated to solve the problems described above. As a result, it was found that the number of steps in a double patterning process can be decreased by forming a coating film on the surface of a first resist pattern. Accordingly, the present invention was accomplished. More specifically, the present invention provides the following.

A first aspect of the present invention provides a method for forming a pattern in which a pattern is formed using a chemically amplified resist composition, the method including the steps of: forming a first resist film by applying a first chemically amplified resist composition on a support; forming a first resist pattern by selectively exposing the first resist film through a first mask pattern followed by development; forming a coating pattern by forming a coating film constituted with a water soluble resin film on the surface of the first resist pattern; forming a second resist film by applying a second chemically amplified resist composition on the support having the coating pattern formed thereon; and forming a second resist pattern by selectively exposing the second resist film through a second mask pattern followed by development.

A second aspect of the present invention provides a material for forming a coating film, in which the material is constituted with an aqueous solution including a water soluble resin and a water soluble crosslinking agent, and in which the material is used for forming the coating film in the method for forming a pattern according to the first aspect.

Effects Of The Invention

According to the present invention, a novel method for forming a pattern capable of decreasing the number of steps in a double patterning process, and a material for forming a coating film suitably used in the method for forming a pattern can be provided.

DETAILED DESCRIPTION OF THE INVENTION

Method for Forming Pattern

Figure 1A:
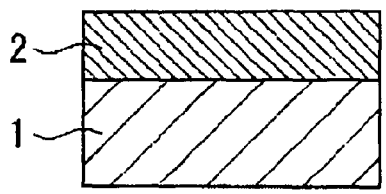
FIG. 1A to FIG. 1E show a schematic process chart for illustrating a preferred embodiment of the method for forming a pattern of the present invention.

In the method for forming a pattern of the present invention, a chemically amplified resist composition is used. The chemically amplified resist composition is not particularly limited, and may be appropriately selected for use from among a large number of chemically amplified resist compositions proposed so far, depending on the exposure light source used, lithography characteristics and the like. The chemically amplified resist composition may be either a negative resist composition or a positive resist composition, and preferably is a positive resist composition.

As the chemically amplified resist composition, those prepared by dissolving a base material component (A) having an alkaline solubility that will be altered by the action of an acid (hereinafter, referred to as component (A)), and an acid generator component (B) that will generate an acid upon exposure (hereinafter, referred to as component (B)) in an organic solvent (S) (hereinafter, referred to as component (S)) are generally employed.

The term "base material component" herein means an organic compound having a film forming ability, and preferably, an organic compound having a molecular weight of no less than 500 may be used. The organic compound having a molecular weight of no less than 500 improves film forming ability, and is likely to enable formation of a nano-scale pattern.

The organic compound having a molecular weight of no less than 500 is generally classified into organic compounds having a low molecular weight of no less than 500 and no greater than 2,000 (hereinafter, referred to as low-molecular compound), and a resin having a high molecular weight of greater than 2,000 (polymer). As the low-molecular compound, a nonpolymer is generally used. In the case in which a resin (polymer) is used, the "molecular weight" employed is a value in terms of the mass-average molecular weight equivalent to polystyrene determined by GPC (gel permeation chromatography). Hereinafter, by referring to merely "resin", a resin having a molecular weight of greater than 2,000 is indicated.

The component (A) may be: a low-molecular compound having an alkaline solubility that will be altered by the action of an acid; a resin having an alkaline solubility that will be altered by the action of an acid; or any mixture of the same.

As the component (A), an organic compound which has been employed as a base material component for a chemically amplified resist can be generally used alone, or as a mixture of two or more thereof.

When the chemically amplified resist composition is a negative resist composition, a base material component having an alkaline solubility that decreases by the action of an acid is used as the component (A), and a crosslinking agent is further blended in the negative resist composition. In such a negative resist composition, when an acid is generated from the component (B) upon exposure, crosslinking occurs between the component (A) and the crosslinking agent by the action of the acid, whereby the component (A) is altered from alkali-soluble to alkali-insoluble. Thus, in forming a resist pattern, when a resist film obtained by applying the negative resist composition on a substrate is selectively exposed, the exposed part becomes alkali-insoluble, whereas the unexposed part remains unchanged as alkali-soluble, thereby enabling development with an alkali.

As the component (A) in the negative resist composition, an alkali-soluble resin is generally used, and a resin having a unit derived from at least one selected from an α-(hydroxyalkyl)acrylic acid and a lower alkyl ester of an α-(hydroxyalkyl)acrylic acid is preferred as the alkali-soluble resin since a favorable resist pattern with less swelling can be formed. The α-(hydroxyalkyl)acrylic acid refers to one or both of: acrylic acid having a hydrogen atom bound to a carbon atom at the α-position to which a carboxy group is bound, and α-hydroxyalkyl acrylic acid having a hydroxyalkyl group (preferably a hydroxyalkyl group having 1 to 5 carbon atoms) bound to the carbon atom at the α-position.

As the crosslinking agent, for example, an amino based crosslinking agent such as glycoluril having a methylol group or an alkoxymethyl group is preferably used in general, since a favorable resist pattern with less swelling can be formed. The amount of the crosslinking agent to be blended is preferably 1 to 50 parts by mass based on 100 parts by mass of the alkali-soluble resin.

When the chemically amplified resist composition is a positive resist composition, a base material component having an acid-dissociable, dissolution-inhibiting group, and having an alkaline solubility that increases by the action of an acid may be used as the component (A). Such a positive resist composition is alkali-insoluble prior to the exposure, and when an acid is generated from the component (B) upon exposure in forming the resist pattern, the component (A) is altered to be alkali-soluble because the acid-dissociable, dissolution-inhibiting group is dissociated by the action of the acid. Therefore, when a resist film obtained by applying the positive resist composition on a substrate is selectively exposed in forming a resist pattern, the exposed part is altered to become alkali-soluble, whereas the unexposed part remains unchanged as alkali-insoluble, thereby enabling development with an alkali.

As the component (A) in the positive resist composition, those having an acid-dissociable, dissolution-inhibiting group are acceptable, and the component (A-1) and/or the component (A-2) described below are preferred. The hydrophilic group may also serve as an acid-dissociable, dissolution-inhibiting group.

Component (A-1): resin having an acid-dissociable, dissolution-inhibiting group.

Component (A-2): low-molecular compound having an acid-dissociable, dissolution-inhibiting group. Preferred embodiments of the component (A-1) and the component (A-2) are more specifically explained below.

[Component (A-1)]

As the component (A-1), resins having a constitutional unit including an acid-dissociable, dissolution-inhibiting group are preferred.

The proportion of the constitutional unit including the acid-dissociable, dissolution-inhibiting group in the resin is preferably 20 to 80% by mole, more preferably 20 to 70% by mole, and still more preferably 30 to 60% by mole based on total mole number of the entire constitutional unit that constitutes the resin.

More specifically, a novolak resin, a hydroxystyrene based resin, an (α-lower alkyl)acrylic ester resin, a copolymerized resin containing a constitutional unit derived from hydroxystyrene and a constitutional unit derived from an (α-lower alkyl)acrylic ester, and the like, which all having an acid-dissociable, dissolution-inhibiting group, may be suitably used as the component (A-1).

The term "(α-lower alkyl)acrylic acid" referred to herein means one or both of acrylic acid ($CH_2$=CH—COOH) and α-lower alkyl acrylic acid. The term "α-lower alkyl acrylic acid" refers to an acrylic acid in which a hydrogen atom bound to a carbon atom to which a carbonyl group is bound is substituted with a lower alkyl group. The term "(α-lower alkyl)acrylic ester" is an ester derivative of "(α-lower alkyl) acrylic acid", and refers to one or both of an acrylic ester and an α-lower alkyl acrylic ester. The term "constitutional unit derived from an (α-lower alkyl)acrylic ester" refers to a constitutional unit formed by cleavage of an ethylenic double bond of an (α-lower alkyl)acrylic ester, which may be hereinafter referred to as "(α-lower alkyl)acrylate constitutional unit". The term "(α-lower alkyl)acrylate" refers to one or both of acrylate and α-lower alkyl acrylate. The term "constitutional unit derived from hydroxystyrene" refers to a constitutional unit formed by cleavage of an ethylenic double bond of hydroxystyrene or α-lower alkyl hydroxystyrene, which may be hereinafter referred to as hydroxystyrene unit. The term "α-lower alkyl hydroxystyrene" refers to a compound in which a lower alkyl group is bound to a carbon atom to which a phenyl group is bound.

In the "constitutional unit derived from an α-lower alkyl acrylic ester" and the "constitutional unit derived from α-lower alkyl hydroxystyrene", the lower alkyl group bound at the α-position is an alkyl group having 1 to 5 carbon atoms, which is preferably a linear or branched alkyl group, and examples thereof include a methyl group, an ethyl group, a propyl group, an isopropyl group, a n-butyl group, an isobutyl group, a tert-butyl group, a pentyl group, an isopentyl group, a neopentyl group, and the like. The methyl group is preferable in industrial aspects.

The resin component which is suitable as the component (A-1) is not particularly limited, and an example thereof may be a resin component (hereinafter, may be referred to as component (A-11)) having a unit including a phenolic hydroxyl group such as the following constitutional unit (a1), a unit including an acid-dissociable, dissolution-inhibiting group such as at least one selected from the following constitutional unit (a2) and the following constitutional unit (a3), and an alkali-insoluble unit such as the following constitutional unit (a4) which is used as needed. In the component (A-11), cleavage is caused in the constitutional unit (a2) and/or the constitutional unit (a3) by the action of the acid generated from the acid generator upon exposure, whereby the alkaline solubility of the resin, which was initially insoluble in an alkaline developer, increases. As a result, by carrying out the exposure and development, a chemically amplified positive-type pattern can be formed.

Constitutional Unit (a1)

The constitutional unit (a1) is a unit having a phenolic hydroxyl group, and preferably is a unit derived from hydroxystyrene represented by the following general formula (1).

(1)

In the formula (1), R represents a hydrogen atom or a lower alkyl group. The lower alkyl group is as described in the foregoing, and in particular, a hydrogen atom or a methyl group is preferred. R is to be similarly defined in the following. The binding position of —OH to the benzene ring is not particularly limited, and the position 4 in the formula (para position) is preferred.

The constitutional unit (a1) is included in an amount of preferably 40 to 80% by mole, and more preferably 50 to 75% by mole in the component (A-11) in view of formability of the pattern. When the amount of the constitutional unit (a1) is no less than 40% by mole, the solubility in an alkaline developer can be improved, and an effect of improving the pattern configuration can be also exhibited. When the amount of the constitutional unit (a1) is no greater than 80% by mole, favorable balance with other constitutional units can be achieved.

Additionally, in view of formability of a coating film on the pattern, the constitutional unit (a1) is included in an amount of preferably no less than 50% by mole, more preferably no less than 60% by mole, and still more preferably no less than 75% by mole in the component (A-11). Although the upper limit is not particularly limited, it may be no greater than 80% by mole. When the amount of the constitutional unit (a1) falls within the above range, the presence of a phenolic hydroxyl group enables a favorable coating film to be formed on the pattern, and thus a pattern having a favorable shape can be obtained. Also, favorable adhesiveness between the pattern and the coating film is achieved.

Constitutional Unit (a2)

The constitutional unit (a2) includes an acid-dissociable, dissolution-inhibiting group, and is represented by the following general formula (2).

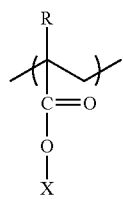

(2)

In the formula (2), R is as defined above, and X represents an acid-dissociable, dissolution-inhibiting group.

The acid-dissociable, dissolution-inhibiting group X may be an acid-dissociable, dissolution-inhibiting group which is an alkyl group having a tertiary carbon atom in which a tertiary carbon atom of the tertiary alkyl group is bound to an ester group [—C(O)O—], a cyclic acetal group such as a tetrahydropyranyl group or a tetrahydrofuranyl group, or the like. As such an acid-dissociable, dissolution-inhibiting group X, for example, any one other than the groups described above among those used in the chemically amplified positive resist composition can be also arbitrarily used.

As the constitutional unit (a2), for example, units represented by the following general formula (3) may be exemplified as a preferable constitutional unit (a2).

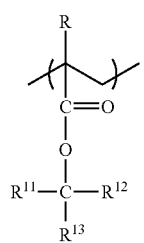

(3)

In the formula (3), R is as defined above; and $R^{11}$, $R^{12}$, and $R^{13}$ each independently represent a lower alkyl group, which may be either linear or branched, and has preferably 1 to 5 carbon atoms. Alternatively, among $R^{11}$, $R^{12}$ and $R^{13}$, $R^{11}$ may be a lower alkyl group, and $R^{12}$ and $R^{13}$ may bind to form a aliphatic monocyclic or polycyclic group, wherein the aliphatic cyclic group has preferably 5 to 12 carbon atoms.

Herein, the term "aliphatic" means that the group or the compound is not aromatic, and the term "aliphatic cyclic group" refers to a monocyclic group or a polycyclic group which is not aromatic.

When $R^{11}$, $R^{12}$ and $R^{13}$ do not have an aliphatic cyclic group, for example, $R^{11}$, $R^{12}$ and $R^{13}$ are preferably all a methyl group.

When any one of $R^{11}$, $R^{12}$ and $R^{13}$ has an aliphatic cyclic group, in the case in which the aliphatic cyclic group is a aliphatic monocyclic group, the constitutional unit (a2) preferably includes, for example, a cyclopentyl group, a cyclohexyl group or the like.

When the alicyclic group is a aliphatic polycyclic group, the constitutional unit (a2) is preferably, for example, one represented by the following general formula (4).

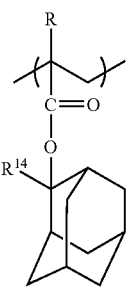

(4)

In the formula (4), R is as defined above; and $R^{14}$ is a lower alkyl group, which may be either linear or branched, and has preferably 1 to 5 carbon atoms.

In addition, preferable examples having an acid-dissociable, dissolution-inhibiting group including a aliphatic polycyclic group include those represented by the following general formula (5).

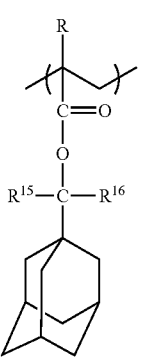

(5)

In the formula (5), R is as defined above, $R^{15}$ and $R^{16}$ each independently may represent a lower alkyl group, which may be either linear or branched and has preferably 1 to 5 carbon atoms.

The constitutional unit (a2) is preferably included in the component (A-11) in an amount of 5 to 50% by mole, preferably 10 to 40% by mole, and still more preferably 10 to 35% by mole.

Constitutional Unit (a3)

The constitutional unit (a3) is a constitutional unit including an acid-dissociable, dissolution-inhibiting group, and is represented by the following general formula (6).

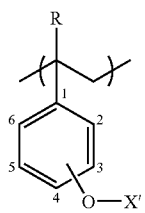

(6)

In the formula (6), R is as defined above, and X' represents an acid-dissociable, dissolution-inhibiting group.

Examples of the acid-dissociable, dissolution-inhibiting group X' include: tertiary alkyloxycarbonyl groups such as a tert-butyloxycarbonyl group, and a tert-amyloxycarbonyl group; tertiary alkyloxycarbonylalkyl groups such as a tert-butyloxycarbonylmethyl group, and a tert-butyloxycarbonylethyl group; tertiary alkyl groups such as a tert-butyl group, and a tert-amyl group; cyclic acetal groups such as a tetrahydropyranyl group, and a tetrahydrofuranyl group; alkoxyalkyl groups such as an ethoxyethyl group, and a methoxypropyl group; and the like.

Among these, a tert-butyloxycarbonyl group, a tert-butyloxycarbonylmethyl group, a tert-butyl group, a tetrahydropyranyl group, and an ethoxyethyl group are preferred.

As the acid-dissociable, dissolution-inhibiting group X', for example, any one other than the groups described above among those used in the chemically amplified positive resist composition can be arbitrarily used.

In the general formula (6), binding position of a group (—OX') to the benzene ring is not particularly limited; however, the position 4 (para position) indicated in the formula is preferred.

The constitutional unit (a3) is included in an amount of 5 to 50% by mole, preferably 10 to 40% by mole, and still more preferably 10 to 35% by mole in the component (A-11).

Constitutional Unit (a4)

The constitutional unit (a4) is an alkali-insoluble constitutional unit, and is represented by the following general formula (7).

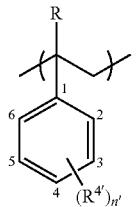

(7)

In the formula (7), R is as defined above; $R^{4'}$ represents a lower alkyl group; and n' represents an integer of 0 to 3.

The lower alkyl group in $R^{4'}$ may be either linear or branched, and preferably has 1 to 5 carbons; and n' represents an integer of 0 to 3, and preferably 0.

The amount of the constitutional unit (a4) is 1 to 40% by mole, and preferably 5 to 25% by mole in the component (A-11). When the amount is no less than 1% by mole, the pattern configuration (particularly, film loss) is effectively improved. Whereas, when the amount is no greater than 40% by mole, superior balance with other constitutional unit can be achieved.

In the component (A-11), the constitutional unit (a1) and at least one constitutional unit selected from the constitutional unit (a2) and constitutional unit (a3) are included as a prerequisite component, and further the constitutional unit (a4) may be arbitrarily included. In addition, a copolymer including all of these respective constitutional units may be used, or a mixture of polymers including one or more of these constitutional units may be also used. Alternatively, these may be used in combination.

Moreover, the component (A-11) may arbitrarily include a unit other than the constitutional units (a1), (a2), (a3) and (a4), and the proportion of these constitutional units is preferably no less than 80% by mole, more preferably no less than 90% by mole, and most preferably 100% by mole.

In particular, an embodiment in which "any one of copolymers including the constitutional units (a1) and (a3), or a mixture of two or more of the copolymers" or "any one of the copolymers including the constitutional units (a1), (a2) and (a4), or a mixture of two or more of the copolymers" is each used or a mixture thereof is used is most preferred because the effect can be readily obtained. Also, such an embodiment is preferred in light of improvement of the heat resistance.

In particular, a mixture of polyhydroxystyrene protected with a tertiary alkyloxycarbonyl group, and polyhydroxystyrene protected with a 1-alkoxyalkyl group is preferred. When such a mixture is prepared, the mixing ratio (mass ratio) of each polymer, i.e., (polyhydroxystyrene protected with a tertiary alkyloxycarbonyl group/polyhydroxystyrene protected with a 1-alkoxyalkyl group) may be, for example, 1/9 to 9/1, preferably 2/8 to 8/2, and more preferably 2/8 to 5/5.

As the resin component, which is suitable as the component (A-1), other than the component (A-11), a resin component including an (α-lower alkyl)acrylic ester resin is preferred, and a resin component constituted with the (α-lower alkyl)acrylic ester resin is more preferred in light of formability of the pattern with lower etching resistance, in particular.

In the (α-lower alkyl)acrylic ester resin, a resin having a constitutional unit (a5) derived from an (α-lower alkyl) acrylic ester including an acid-dissociable, dissolution-inhibiting group is preferred. The α-lower alkyl group is as defined in the foregoing.

The acid-dissociable, dissolution-inhibiting group of the constitutional unit (a5) is a group which has an alkali dissolution-inhibiting property that makes the entire component (A-12) before the exposure alkali-insoluble, and which alters the entire component (A-12) to be alkali-soluble through dissociation due to the action of the acid generated from the component (B) after the exposure.

Additionally, in the (α-lower alkyl)acrylic ester resin component, when the acid-dissociable, dissolution-inhibiting group in the constitutional unit (a5) is dissociated due to the acid generated from the component (B), a carboxylic acid is generated. Because of the presence of thus generated carboxylic acid, adhesiveness with the coating film formed on the resist pattern is improved.

The acid-dissociable, dissolution-inhibiting group may be appropriately selected for use from among a large number of those proposed for use in, for example, resins for resist compositions of an ArF excimer laser. In general, groups that form a cyclic or chain tertiary alkyl ester with the carboxy group of an (α-lower alkyl)acrylic acid, or cyclic or chain alkoxyalkyl groups, and the like have been widely known.

Herein, the term "group that forms a tertiary alkyl ester" means a group that forms an ester by substituting the carboxy group of acrylic acid with a hydrogen atom. More specifically, the term refers to a structure in which a tertiary carbon atom of a chain or cyclic tertiary alkyl group binds to the oxygen atom at the end of the carbonyloxy group [—C(O)—O—] of an acrylic ester. In such a tertiary alkyl ester, binding between the oxygen atom and the tertiary carbon atom is cleaved upon the action of an acid.

The term "tertiary alkyl group" means an alkyl group having a tertiary carbon atom. Examples of the group that forms a chain tertiary alkyl ester include a tert-butyl group, a tert-amyl group, and the like. Examples of the group that forms a cyclic tertiary alkyl ester include those similar to the groups illustrated for the "acid-dissociable, dissolution-inhibiting group that contains an aliphatic cyclic group" described later.

The "cyclic or chain alkoxyalkyl group" forms an ester by substituting the hydrogen atom of the carboxy group. More specifically, a structure in which the alkoxyalkyl group is bound to an oxygen atom at the end of the carbonyloxy group [—C(O)—O—] of the acrylic ester. In such a structure, binding between the oxygen atom and the alkoxyalkyl group is cleaved upon the action of an acid.

Examples of the cyclic or chain alkoxyalkyl group include a 1-methoxymethyl group, a 1-ethoxyethyl group, 1-isopropoxyethyl group, a 1-cyclohexyloxyethyl group, a 2-adamantoxymethyl group, a 1-methyladamantoxymethyl group, a 4-oxo-2-adamantoxymethyl group, a 1-adamantoxyethyl group, a 2-adamantoxyethyl group, and the like.

As the constitutional unit (a5), a constitutional unit including an acid-dissociable, dissolution-inhibiting group that contains a cyclic group, particularly an aliphatic cyclic group is preferred. The terms, "aliphatic" and "aliphatic cyclic group" herein are as defined above.

The aliphatic cyclic group may be either monocyclic or polycyclic, and may be appropriately selected for use from among a large number of those proposed for use in, for example, ArF resists and the like. The aliphatic polycyclic groups are preferred in light of the etching resistance. In addition, the aliphatic cyclic group is preferably a hydrocarbon group, particularly preferably a saturated hydrocarbon group (aliphatic cyclic group).

Examples of the aliphatic monocyclic group include, for example, groups derived by removing one hydrogen atom from cycloalkane. Illustrative examples of the aliphatic polycyclic group include groups derived by removing one hydrogen atom from bicycloalkane, tricycloalkane, tetracycloalkane or the like, and the like.

Specific examples of the aliphatic monocyclic group include a cyclopentyl group, a cyclohexyl group, and the like. Examples of the aliphatic polycyclic group include groups derived by removing one hydrogen atom from polycycloalkane such as adamantane, norbornane, isobornane, tricyclodecane, or tetracyclododecane, and the like. Among these, an adamantyl group derived by removing one hydrogen atom from adamantane, a norbornyl group derived by removing one hydrogen atom from norbornane, a tricyclodecanyl group derived by removing one hydrogen atom from tricyclodecane, a tetracyclododecanyl group derived by removing one hydrogen atom from tetracyclododecane are industrially preferred.

More specifically, the constitutional unit (a5) is preferably at least one selected from those represented by the following general formulae (1') to (3'). Furthermore, the constitutional unit (a5) may be a unit derived from an (α-lower alkyl)acrylic ester, which has the aforementioned cyclic alkyloxyalkyl group at the ester portion thereof, and specifically, at least one selected from units derived from an aliphatic polycyclic alkyloxy lower alkyl (α-lower alkyl)acrylic ester which may have a substituent such as a 2-adamantoxymethyl group, a 1-methyladamantoxymethyl group, a 4-oxo-2-adamantoxymethyl group, a 1-adamantoxyethyl group, or a 2-adamantoxyethyl group is preferred.

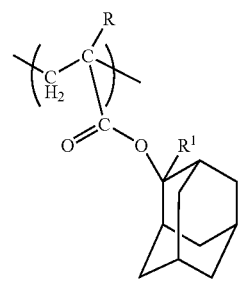

(1')

In the formula (1'), R is as defined above, and R' represents a lower alkyl group.

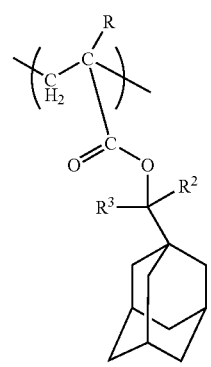

(2')

In the formula (2'), R is as defined above, and $R^2$ and $R^3$ each independently represent a lower alkyl group.

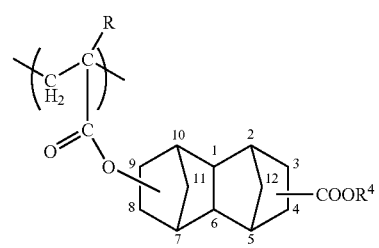

(3')

In the formula (3'), R is as defined above, and $R^4$ represents a tertiary alkyl group.

In the general formulae (1') to (3'), the hydrogen atom or the lower alkyl group in R is to be similarly defined as that for the hydrogen atom or the lower alkyl group bound to the position α of the aforementioned acrylic ester.

The lower alkyl group in $R^1$ is preferably a linear or branched alkyl group having 1 to 5 carbon atoms, and specific examples include a methyl group, an ethyl group, a propyl group, an isopropyl group, a n-butyl group, an isobutyl group, a pentyl group, an isopentyl group, a neopentyl group, and the like. Among these, a methyl group, and an ethyl group are preferred since they are readily available in industrial aspects.

It is preferred that the lower alkyl groups in $R^2$ and $R^3$ be each independently, a linear or branched alkyl group having 1 to 5 carbon atoms. Among these, it is preferred that $R^2$ and $R^3$ be both a methyl group in industrial aspects. Specifically, a constitutional unit derived from 2-(1-adamantyl)-2-propylacrylate may be exemplified.

$R^4$ is a chain tertiary alkyl group or a cyclic tertiary alkyl group. Examples of the chain tertiary alkyl group include a tert-butyl group and a tert-amyl group, and a tert-butyl group is preferred in industrial aspects. The cyclic tertiary alkyl group is as illustrated for the "acid-dissociable, dissolution-inhibiting group that contains an aliphatic cyclic group" described above, and examples include a 2-methyl-2-adamantyl group, a 2-ethyl-2-adamantyl group, a 2-(1-adamantyl)-2-propyl group, a 1-ethylcyclohexyl group, a 1-ethylcyclopentyl group, a 1-methylcyclohexyl group, a 1-methylcyclopentyl group, and the like.

Furthermore, the group —COOR$^4$ may bind to the position 3 or 4 of the tetracyclododecanyl group represented in the formula, but the binding position is not particularly limited. Moreover, the residue of the carboxy group of the acrylate constitutional unit may similarly bind to the position 8 or 9 represented in the formula.

The constitutional unit (a5) can be used alone, or in combination of two or more thereof. In the (α-lower alkyl)acrylic ester resin component, the proportion of the constitutional unit (a5) is preferably 20 to 60% by mole, more preferably 30 to 50% by mole, and most preferably 35 to 45% by mole based on the total mole number of the entire constitutional units that constitute the (α-lower alkyl)acrylic ester resin component. By thus including the constitutional unit (a5) in an amount of no less than the lower limit, the pattern can be obtained. Whereas, by thus including the constitutional unit (a5) in an amount of no greater than the upper limit, favorable balance with other constitutional unit can be achieved.

The (α-lower alkyl)acrylic ester resin further has, in addition to the constitutional unit (a5), preferably a constitutional unit (a6) derived from an acrylic ester including a lactone ring. The constitutional unit (a6) is effective in improving adhesiveness of the resist film to the substrate, or in improving hydrophilicity with the developer. In addition, a coating film having great adhesiveness with the pattern can be formed.

In the constitutional unit (a6), what is bound to the carbon atom at the α-position is a lower alkyl group or a hydrogen atom. The lower alkyl group bound to the carbon atom at the α-position is similar to that for the constitutional unit (a5), and is preferably a methyl group.

Examples of the constitutional unit (a6) include constitutional units in which a monocyclic group including a lactone ring or a polycyclic group having a lactone ring is bound to an ester side chain portion of an acrylic ester. Herein, the term "lactone ring" means a ring that includes a —O—C(O)— structure, which is counted as the first ring. Thus, a cyclic group that includes a lactone ring alone is referred to as a monocyclic group, and one that further includes other ring structure is referred to as a polycyclic group irrespective of the structure.

In addition, examples of the constitutional unit (a6) include those having a monocyclic group obtained by removing one hydrogen atom from γ-butyrolactone, or having a polycyclic group obtained by removing one hydrogen atom from lactone ring-containing bicycloalkane, and the like.

More specifically, the constitutional unit (a6) is preferably at least one selected from the units represented by the following general formulae (4') to (7').

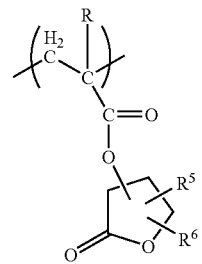

(4')

In the formula (4'), R is as defined above, and $R^5$ and $R^6$ each independently represent a hydrogen atom or a lower alkyl group.

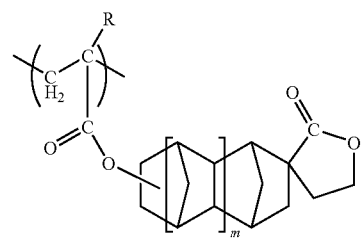

(5')

In the formula (5'), R is as defined above, and m is an integer of 0 or 1.

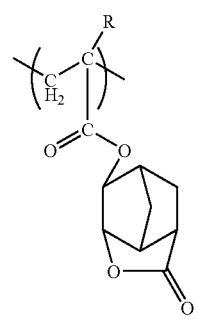

(6')

In the formula (6'), R is as defined above.

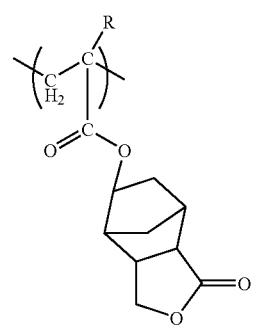

(7')

In the formula (7'), R is as defined above.

In the general formula (4'), $R^5$ and $R^6$ are each independently a hydrogen atom or a lower alkyl group, and is preferably a hydrogen atom. In $R^5$ and $R^6$, the lower alkyl group is preferably a linear or branched alkyl group having 1 to 5 carbon atoms, and examples thereof include a methyl group, an ethyl group, a propyl group, an isopropyl group, a n-butyl group, an isobutyl group, a tert-butyl group, a pentyl group, an isopentyl group, a neopentyl group, and the like. The methyl group is preferred in industrial aspects.

Among the constitutional units represented by the general formulae (4') to (7'), the constitutional unit represented by the general formula (4') is inexpensive and preferred from an industrial aspect. Of the constitutional units represented by the general formula (4'), α-methacryloyloxy-γ-butyrolactone is most preferred in which: R is a methyl group; $R^5$ and $R^6$ are a hydrogen atom; the ester bond between the methacrylic ester and γ-butyrolactone is at the α-position of the lactone ring thereof.

The constitutional unit (a6) may be used alone, or in combination of two or more thereof. In the (α-lower alkyl)acrylic ester resin component, the proportion of the constitutional unit (a6) is preferably 20 to 60% by mole, more preferably 20 to 50% by mole, and most preferably 30 to 45% by mole based on total mole number of the entire constitutional units that constitute the (α-lower alkyl)acrylic ester resin component. By including the constitutional unit (a6) in an amount of no less than the lower limit, the lithography characteristics can be improved. Whereas, by including the constitutional unit (a6) in an amount of no greater than the upper limit, favorable balance with other constitutional unit can be achieved.

The (α-lower alkyl)acrylic ester resin component further includes in addition to the constitutional unit (a5), or to the constitutional units (a5) and (a6), preferably a constitutional unit (a7) derived from an acrylic ester that includes a polar group-containing polycyclic group. The constitutional unit (a7) improves the hydrophilicity of the entire (α-lower alkyl) acrylic ester resin component, and thus the affinity with the developer can be improved, leading to increase in the alkaline solubility at the exposed part, thereby contributing to an improvement in the resolving ability.

In the constitutional unit (a7), a lower alkyl group or a hydrogen atom may be bound to the carbon atom at the α-position. The lower alkyl group which may bind to the carbon atom at the α-position is similar to that described in connection with the constitutional unit (a5), and is preferably a methyl group. Examples of the polar group include a hydroxyl group, a cyano group, a carboxy group, an amino group, and the like, and a hydroxyl group is particularly preferred. The polycyclic group may be appropriately selected for use from among the aliphatic cyclic groups which are polycyclic as illustrated in the "acid-dissociable, dissolution-inhibiting group that contains an aliphatic cyclic group" in connection with the unit (a5) described above.

The constitutional unit (a7) is preferably at least one selected from those represented by the following general formulae (8') to (9').

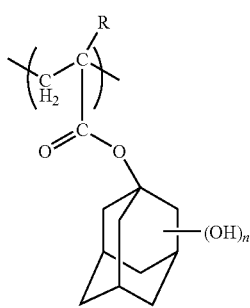

(8')

In the formula (8'), R is as defined above, and n is an integer of 1 to 3.

R in the general formula (8') is similar to R in the above general formulae (1') to (3'). Among these, those in which n is 1, and the hydroxyl group is bound at the position 3 of the adamantyl group are preferred.

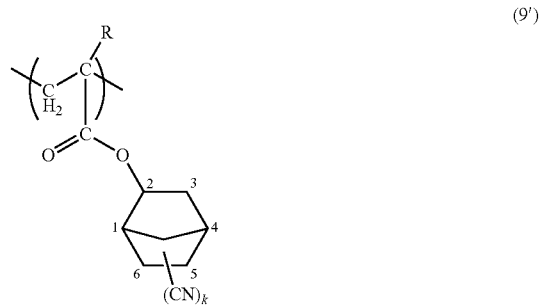

(9')

In the formula (9'), R is as defined above, and k is an integer of 1 to 3.

Among these, k is preferably 1. In addition, the cyano group preferably binds to the position 5 or position 6 of the norbornanyl group.

The constitutional unit (a7) may be used alone, or in combination of two or more thereof. The proportion of the constitutional unit (a7) in the (α-lower alkyl)acrylic ester resin component is preferably 10 to 50% by mole, more preferably 15 to 40% by mole, and still more preferably 20 to 35% by mole based on total mole number of the entire constitutional units that constitute the (α-lower alkyl)acrylic ester resin component. By thus including the constitutional unit (a7) in an amount of no less than the lower limit, the lithography characteristics can be improved. Whereas, by including the constitutional unit (a7) in an amount of no greater than the upper limit, favorable balance with other constitutional unit can be achieved.

In the (α-lower alkyl)acrylic ester resin component, total mole number of the constitutional units (a5) to (a7) accounts for preferably 70 to 100% by mole, and more preferably 80 to 100% by mole in the total mole number of the entire constitutional units.

The (α-lower alkyl)acrylic ester resin component may include a constitutional unit (a8) other than the aforementioned constitutional units (a5) to (a7). The constitutional unit (a8) is not particularly limited as long as it is a different constitutional unit which is not included in the aforementioned constitutional units (a5) to (a7).

For example, a constitutional unit that includes a polycyclic aliphatic hydrocarbon group, and is derived from an (α-lower alkyl)acrylic ester, or the like is preferred. The polycyclic aliphatic hydrocarbon group may be appropriately selected for use from among, for example, the aliphatic cyclic groups which are polycyclic as illustrated in the "acid-dissociable, dissolution-inhibiting group that contains an aliphatic cyclic group" described above. In particular, at least one selected from a tricyclodecanyl group, an adamantyl group, a tetracyclododecanyl group, a norbornyl group, and an isobornyl group is preferred in terms of industrial availability, and the like. The constitutional unit (a8) is most preferably an acid-indissociable group.

Specifically, illustrative examples of the constitutional unit (a8) include those having a structure represented by the following formulae (10) to (12).

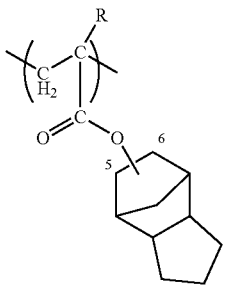

In the formula (10), R is as defined above.

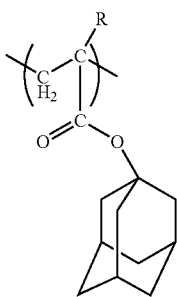

In the formula (11), R is as defined above.

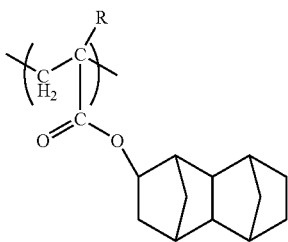

In the formula (12), R is as defined above.

When the constitutional unit (a8) is included, the proportion of the constitutional unit (a8) in the (α-lower alkyl) acrylic ester resin component is preferably 1 to 25% by mole, and more preferably 5 to 20% by mole based on total mole number of the entire constitutional units that constitute the (α-lower alkyl)acrylic ester resin component.

The (α-lower alkyl)acrylic ester resin component is preferably a copolymer having at least constitutional units (a5), (a6) and (a7). Illustrative examples of the copolymer include copolymers including the constitutional units (a5), (a6) and (a7), copolymers including the constitutional units (a5), (a6), (a7) and (a8), and the like.

The component (A-11) can be obtained by polymerization of the monomer according to the aforementioned constitutional unit by a known method. For example the component (A-11) can be obtained by polymerization of the monomer according to each constitutional unit by known radical polymerization initiator such as, for example, azobis isobutyronitrile (AIBN), or the like.

The component (A-1) has a mass-average molecular weight (equivalent polystyrene mass-average molecular weight determined by gel permeation chromatography, the same is applied hereinbelow) of preferably no greater than 30,000, more preferably no greater than 20,000, and still more preferably no greater than 12,000. The lower limit value is acceptable as long as it exceeds 2,000, and is preferably no less than 4,000, and more preferably no less than 5,000 in light of inhibition of the pattern collapse, improvement of the resolving ability, and the like.

[Component (A-2)]

The component (A-2) is preferably a low-molecular compound having a molecular weight of no less than 500 and no greater than 2,000, and having an acid-dissociable, dissolution-inhibiting group X or X' as illustrated for the component (A-1). Specifically, compounds having a plurality of phenol skeletons in which a part of hydrogen atoms in the hydroxyl groups is substituted with the acid-dissociable, dissolution-inhibiting group X or X' described above may be exemplified.

It is preferred that the component (A-2) be, for example, a low-molecular weight phenol compound known as a sensitizer or a heat resistance improving agent in non-chemically amplified g-ray or i-ray resists, in which a part of hydrogen atoms in the hydroxyl groups is substituted with the acid-dissociable, dissolution-inhibiting group. The component (A-2) may be used from among such compounds arbitrarily.

Examples of such low molecular weight phenol compounds include those described below.

Bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, formalin condensates of a phenol having two, three, or four nuclei, such as phenol, m-cresol, p-cresol or xylenol, and the like, but not limited thereto.

The acid-dissociable, dissolution-inhibiting group is not also limited particularly, but those described above may be exemplified.

Component (B)

The component (B) may be appropriately selected for use from among conventionally known acid generators in chemically amplified resists. As such an acid generator, a wide variety of those have been conventionally known such as: onium salt based acid generators such as iodonium salts and sulfonium salts; oxime sulfonate based acid generators; diazomethane based acid generators such as bisalkyl or bisarylsulfonyl diazomethanes and poly (bissulfonyl)diazomethanes; nitrobenzyl sulfonate based acid generators; iminosulfonate based acid generators; disulfone based acid generator; and the like.

Specific examples of the onium salt based acid generator include diphenyliodonium trifluoromethane sulfonate, (4-methoxyphenyl)phenyliodonium trifluoromethane sulfonate, bis(p-tert-butylphenyl) iodonium trifluoromethane sulfonate, triphenylsulfonium trifluoromethane sulfonate, (4-methoxyphenyl)diphenylsulfonium trifluoromethane sulfonate, (4-methylphenyl)diphenylsulfonium nonafluorobutane sulfonate, (p-tert-butylphenyl)diphenylsulfonium trifluoromethane sulfonate, diphenyliodonium nonafluorobutane sulfonate, bis(p-tert-butylphenyl)iodonium nonafluorobutane sulfonate, and triphenylsulfonium nonafluorobutane sulfonate. Among these, onium salts in which a fluorinated alkylsulfonic acid ion is included as an anion are preferred.

Examples of the oxime sulfonate compound include α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, α-(methylsulfonyloxyimino)-p-bromophenylacetonitrile, and the like. Among these, α-(methylsulfonyloxyimino)-p-methoxyphenylacetonitrile is preferred.

Specific examples of the diazomethane based acid generator include bis(isopropylsulfonyl)diazomethane, bis(p-toluenesulfonyl)diazomethane, bis(1,1-dimethylethylsulfonyl) diazomethane, bis(cyclohexylsulfonyl)diazomethane, bis(2, 4-dimethylphenylsulfonyl)diazomethane, and the like.

As the component (B), a single acid generator may be used alone, or two or more acid generators may be used in combination.

The amount of the component (B) used is 1 to 20 parts by mass, and preferably 2 to 10 parts by mass based on 100 parts by mass of the component (A). By including the component (B) in an amount not below the above lower limit, sufficient pattern formation is achieved. Whereas, when the amount does not exceed the upper limit of the above range, homogeneity of the solution is likely to be accomplished, whereby favorable storage stability is achieved.

Optional Component

In order to improve the pattern configuration, and enhance the post exposure stability, (D) a nitrogen-containing organic compound (hereinafter referred to as "component (D)") may be additionally incorporated as an optional component into the chemically amplified resist composition. The component (D) may be selected from a large variety of known compounds proposed hitherto, and amines, in particular secondary lower aliphatic amines and tertiary lower aliphatic amines are preferred.

The lower aliphatic amine herein refers to amines of alkyl or alkyl alcohol having no greater than 5 carbon atoms. Examples of the secondary and tertiary amines include trimethylamine, diethylamine, triethylamine, di-n-propylamine, tri-n-propylamine, tripentylamine, diethanolamine, triethanolamine, triisopropanolamine, and the like. In particular, tertiary alkanolamines such as triethanolamine and triisopropanolamine are preferred.

These may be used alone, or in combination of two or more thereof. The component (D) is used generally in the range of 0.01 to 5.0 parts by mass based on 100 parts by mass of the component (A).

Furthermore, in order to prevent degradation in sensitivity due to the blending with the component (D), and to improve the pattern configuration and enhance the post exposure stability, (E) an organic carboxylic acid or phosphorous oxo acid, or a derivative thereof (hereinafter referred to as component (E)) may be additionally incorporated as an optional component. Furthermore, the component (D) and the component (E) may be utilized in combination, or either one may be used alone.

Preferable examples of the organic carboxylic acid include malonic acid, citric acid, malic acid, succinic acid, benzoic acid, salicylic acid, and the like.

Examples of the phosphorus oxo acid or derivatives thereof include phosphoric acid or derivatives thereof such as esters, such as e.g., phosphoric acid, phosphoric acid di-n-butyl ester, and phosphoric acid diphenyl ester; phosphonic acid and derivatives thereof such as esters, such as phosphonic acid, phosphonic acid dimethyl ester, phosphonic acid-di-n-butyl ester, phenylphosphonic acid, phosphonic acid diphenyl ester, and phosphonic acid dibenzyl ester; phosphinic acid and derivatives thereof such as esters, such as phosphinic acid, and phenylphosphinic acid. Among these, phosphonic acid is particularly preferred.

The component (E) is used at a proportion of usually 0.01 to 5.0 parts by mass based on 100 parts by mass of the component (A).

The chemically amplified resist composition may further contain miscible additives if desired such as, for example: an additional resin for improving the characteristics of a coating film of the resist composition; a surfactant for improving application abilities; a dissolution-preventing agent; a plasticizer; a stabilizer; a colorant, and a halation inhibitor.

The chemically amplified resist composition can be produced by dissolving the materials in an organic solvent (S) (hereinafter, referred to as "component (S)"). As the component (S), any one that can dissolve each component used and can yield a homogeneous solution is acceptable, and any one or more solvents may be appropriately selected for use from among conventionally known solvents for resist compositions.

Specific examples of the component (S) include lactones such as γ-butyrolactone; ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, propylene glycol monomethyl ether acetate (PGMEA) and dipropylene glycol, as well as monomethyl ether, monoethyl ether, monopropyl ether, monobutyl ether or monophenyl ether of dipropylene glycol monoacetate; cyclic ethers such as dioxane; esters such as methyl lactate, ethyl lactate (EL), methyl acetate, ethyl acetate, butyl acetate, methyl pyruvate, ethyl pyruvate, methyl methoxypropionate and ethyl ethoxypropionate; and the like. Among these, PGMEA, EL, and propylene glycol monomethyl ether (PGME) are preferred. These organic solvents may be used alone, or in combination of two or more thereof.

The amount of the component (S) used is not particularly limited, but the component (S) may be used in an amount sufficient to provide a liquid having a density which enables the chemically amplified resist composition to be applied on a support.

The method for forming a pattern of the present invention includes the steps of: forming a first resist film by applying a first chemically amplified resist composition on a support (hereinafter, referred to as film formation step (1)); forming a first resist pattern by selectively exposing the first resist film through a first mask pattern followed by development (hereinafter, referred to as patterning step (1)); forming a coating pattern by forming a coating film constituted with a water soluble resin film on the surface of the first resist pattern (hereinafter, referred to as coating step); forming a second resist film by applying a second chemically amplified resist composition on the support having the coating pattern formed thereon (hereinafter, referred to as film formation step (2)); and forming a pattern by selectively exposing the second resist film through a second mask pattern followed by development (hereinafter, referred to as patterning step (2)).

Hereinbelow, a preferred embodiment of the method for forming a pattern of the present invention is described with reference to FIG. 1. This embodiment demonstrates an example in which a positive resist composition is used as the first and the second chemically amplified resist compositions.

Figure 1B:
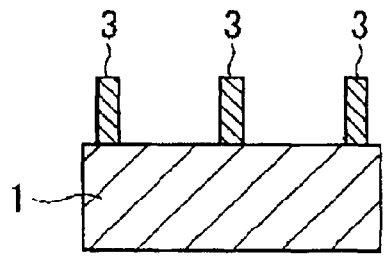
Figure 1C:
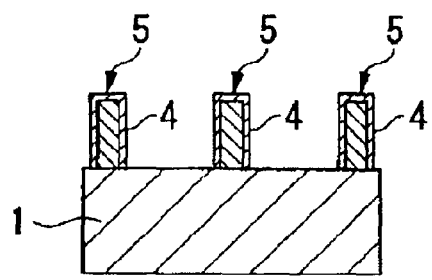
Figure 1D:
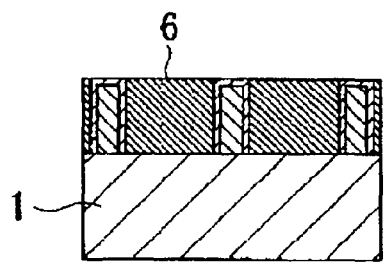
Figure 1E:
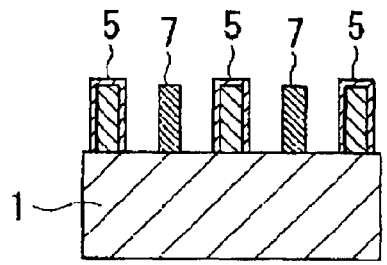
Figure 2A:
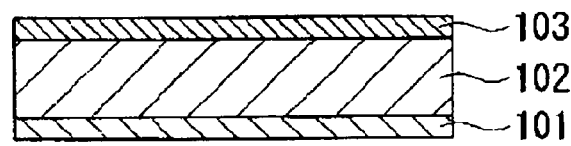
FIG. 2A to FIG. 2F show a schematic process chart for illustrating one example of a conventional double patterning process.
Figure 2B:
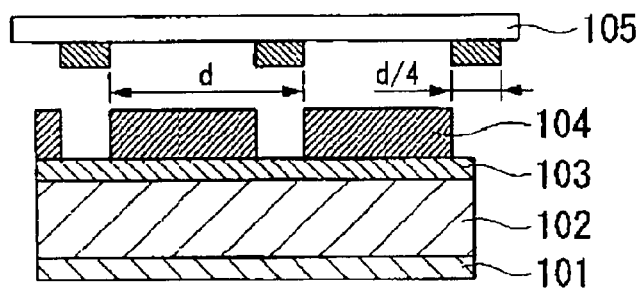
Figure 2C:
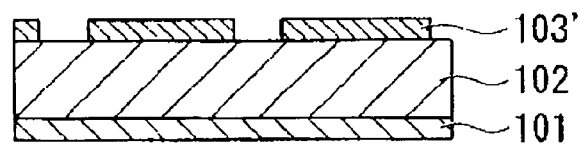
Figure 2D:
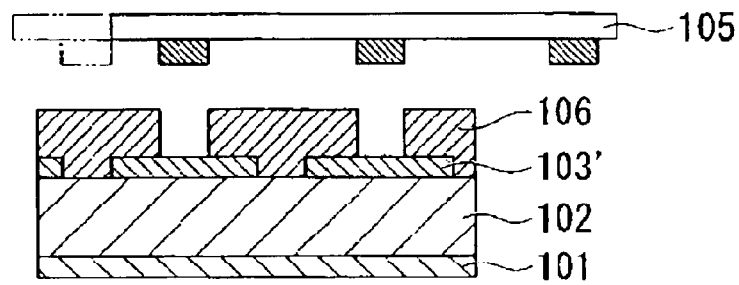
Figure 2E:
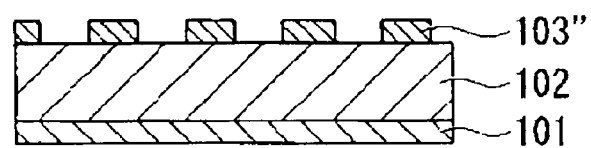
Figure 2F:
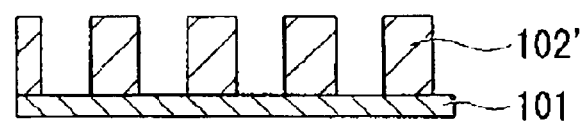

In this embodiment, as shown in FIG. 1A, a first chemically amplified resist composition is first applied on support 1 to form first resist film 2. Next, as shown in FIG. 1B, the first resist film 2 is selectively exposed and developed to form multiple first resist patterns 3. Next, as shown in FIG. 1C, coating films 4 constituted with a water soluble resin film are formed on the surface of the multiple first resist patterns 3, respectively, to form multiple coating patterns 5. Next, as shown in FIG. 1D, a second chemically amplified resist composition is applied on the support 1 having the multiple coating patterns 5 formed thereon to form second resist film 6 that fills in the airspace among the multiple coating patterns 5. Next, as shown in FIG. 1E, a site distinct from the site of the second resist film 6 where the multiple coating patterns 5 were formed thereon is selectively exposed and developed. The exposed part of the second resist film 6 is removed by the development, and as a result, a pattern including multiple second resist patterns 7, and multiple coating patterns 5 (hereinafter, such a pattern including the resist pattern and the coating pattern may be referred to as "composite pattern") is formed on the support 1.

Accordingly, a composite pattern having a smaller pitch than that of the resist pattern 3 formed in the patterning step (1) is formed on the support 1. Hereinafter, each step will be explained in more detail.

[Film Formation Step (1)]

The support 1 is not particularly limited, and conventionally known support can be used. For example, a substrate for electronic parts, such as a substrate on which a predetermined wiring pattern is formed, and the like can be exemplified. More specifically, examples of the substrate include silicon wafers, substrates made of a metal such as copper, chromium, iron or aluminum, glass substrates, and the like. As the material for the wiring pattern, for example, copper, aluminum, nickel, gold or the like can be used.

Also, as the support 1, the substrate as described above on which an inorganic and/or organic film is provided may be employed. As the inorganic film, inorganic anti reflective coating films (inorganic BARC) may be exemplified. As the organic film, organic anti reflective coating films (organic BARC) as well as organic films such as lower layer films in a multilayer resist method may be exemplified. In particular, to provide the lower layer film is preferred since a pattern with a high aspect ratio can be formed on the substrate, and thus is useful in manufacture of semiconductors.

The multilayer resist method herein refers to a method in which an organic film of at least one layer (lower layer film), and a resist film of at least one layer are provided on a substrate, and patterning of the lower layer is carried out using a resist pattern formed on the resist film of the upper layer as a mask. This method reportedly enables a pattern with a high aspect ratio to be formed. The multilayer resist method is classified fundamentally into: a method to provide a bilayer structure including the upper layer resist film and the lower layer film; and a method to provide a multilayer structure including three or more layers by placing one or more inter layer(s) (metal thin film or the like) between the resist film and the lower layer film. According to the multilayer resist method, a necessary thickness can be secured by placing the lower layer film, and thus the resist film is thinned, whereby formation of a micropattern with a high aspect ratio is enabled.

When the organic film is provided, the organic film can be formed by, for example: applying a material for forming an organic film, which is prepared by dissolving a resin component and the like for constituting the organic film in an organic solvent, on a substrate with a spinner or the like; and subjecting to a baking treatment under a heating condition of preferably at 200 to 300° C., for preferably 30 to 300 sec, and more preferably 60 to 180 sec. The material for forming an organic film will be described later in detail.

The organic film has a thickness of preferably 10 to 500 nm, and more preferably 50 to 450 nm. Providing the organic film having a thickness within the above range leads to effects such as to enable formation of a pattern with a high aspect ratio, and to enable securing of sufficient etching resistance in etching of the substrate.

The first chemically amplified resist composition is not particularly limited, and may be appropriately selected for use from among a large number of chemically amplified resist compositions proposed as a chemically amplified resist composition, as described above.

The first resist film 2 can be formed by applying the first chemically amplified resist composition on the support. The first chemically amplified resist composition can be applied by a conventionally known method using a spinner or the like.

Specifically, the first resist film can be formed by, for example: applying the first chemically amplified resist composition on the support using a spinner or the like, and subjecting to a baking treatment (prebaking) under a temperature condition of 80 to 150° C. for 40 to 120 sec, and preferably 60 to 90 sec to volatilize the organic solvent.

The resist film 2 has a thickness of preferably 50 to 500 nm, and more preferably 50 to 450 nm. Providing the resist film having a thickness within the above range leads to effects such as to enable formation of a resist pattern with a high resolution, and to enable achieving sufficient resistance to etching.

[Patterning Step (1)]

The patterning step (1) can be carried out by utilizing a conventionally known method. For example, the first resist film 2 is selectively exposed through a mask having a predetermined pattern formed thereto (mask pattern), followed by subjecting to a baking treatment (PEB (post exposure baking)) under a temperature condition of 80 to 150° C. for 40 to 120 sec, and preferably 60 to 90 sec, and then alkali development is conducted with, for example, an aqueous tetramethyl ammonium hydroxide (TMAH) solution having a concentration of 0.1 to 10% by mass. Accordingly, when the resist composition employed is of a positive type, the exposed part is removed, whereas in the case of the negative type, the unexposed part is removed to permit formation of the first resist pattern 3.

The wavelength used in the exposure is not particularly limited, and the exposure can be conducted using radiation such as a KrF excimer laser, an ArF excimer laser, an $F_2$ excimer laser, EUV (extreme ultraviolet ray), VUV (vacuum ultraviolet ray), EB (electron beam), an X-ray, and a soft X-ray.

The selective exposure of the first resist film 2 in this step may be general exposure conducted in an inert gas such as nitrogen or air (dry exposure), or liquid immersion exposure.

In the liquid immersion exposure, exposure is conducted while allowing a solvent (liquid immersion medium) having a refractive index greater than that of the air to be filled in a part between the resist film on the wafer and the lens, which has been conventionally filled with an inert gas such as nitrogen or air in the exposure, as described above. More specifically, the liquid immersion exposure can be performed by filling in between the resist film obtained as described above and the lens positioned at the undermost of the exposure device with a solvent (liquid immersion medium) having a refractive index greater than that of air, and then exposing through a desired mask pattern in such a state (immersion exposure).

As the liquid immersion medium, a solvent having a refractive index greater than that of the air, and less than that of the resist film formed using the positive resist composition of the present invention is preferred. The refractive index of such a solvent is not particularly limited as long as it falls within the range as described above.

Examples of the solvent having a refractive index greater than that of the air, and less than that of the resist film include water, fluorocarbon inert liquids, silicon based solvents, hydrocarbon based solvents, and the like.

Specific examples of the fluorocarbon inert liquid include liquids containing a fluorocarbon compound such as $C_3HCl_2F_5$, $C_4F_9OCH_3$, $C_4F_9OC_2H_5$ or $C_5H_3F_7$ as a principal component. The fluorocarbon inert liquid has a boiling point of preferably 70 to 180° C., and more preferably 80 to 160° C. The fluorocarbon inert liquid having a boiling point that falls within the above range is preferred since elimination of the medium used in the liquid immersion can be carried out by a simple process after completing the exposure.

The fluorocarbon inert liquid is particularly preferably a perfluoroalkyl compound in which all hydrogen atoms of the alkyl group are substituted with a fluorine atom. Specific examples of the perfluoroalkyl compound include perfluoroalkyl ether compounds, and perfluoroalkylamine compounds.

Further specifically, perfluoro(2-butyl-tetrahydrofuran) (boiling point: 102° C.) may be exemplified as the perfluoroalkyl ether compound, while perfluorotributylamine (boiling point: 174° C.) may be exemplified as the perfluoroalkylamine compound.

[Coating Step]

Next, coating films 4 constituted with a water soluble resin film are formed on the surface of thus formed multiple first resist patterns 3, respectively, whereby multiple coating patterns 5 are formed.

As the method for forming the coating film 4, a method in which a material for forming a coating film, which is constituted with an aqueous solution that contains a water soluble resin and a water soluble crosslinking agent, is preferably employed. The material for forming a coating film will be described in detail in explanation of the material for forming a coating film of the present invention described later.

When this material for forming a coating film is used, the coating film 4 can be formed by, for example, applying the material for forming a coating film on the surface of the pattern to form a coating film, and thereafter subjecting the coating film to a baking treatment. Alternatively, the coating film may be subjected to a prebaking treatment at a temperature of 80 to 180° C. for about 30 to 180 sec, prior to the baking treatment.

Known methods can be employed as the method for applying the material for forming a coating film, such as for example: a method in which the support 1 having the first resist pattern 3 formed thereon is immersed in a material for forming a coating film (dip coating method); a method in which a material for forming a coating film is applied on the support 1 by a spin coating method; and the like. Alternatively, methods such as a layer-by-layer sequential adsorption method and the like also enable the formation.

In the coating step, the coating film is subjected to a baking treatment after applying the material for forming a coating film. By subjecting to the baking treatment, diffusion of the acid from the first resist pattern 3 is accelerated, whereby a crosslinking reaction is caused at the interface of the first resist pattern 3 and the coating film. This crosslinking reaction forms the coating film 4 on the surface of the first resist pattern.

In the baking treatment, the baking temperature is preferably 70 to 180° C., and more preferably 80 to 170° C. By baking at a temperature falling within this range, a rigid coating film 4 can be formed. Although the baking time period is not particularly limited, it is preferably 30 to 300 sec, and more preferably 60 to 180 sec, taking into consideration the effect achieved by the baking treatment, and the stability of the pattern configuration.

In the coating step, the surface of the support 1 is preferably washed with a cleaning liquid after applying the material for forming a coating film. Thus, even though the excess water soluble resin is adhered to the surface of the part where the resist film is not present (part without pattern) on the support 1, such a resin can be washed away by the cleaning liquid, or its concentration is extremely lowered. Meanwhile, since the water soluble resin on the surface of the resist pattern 3 is crosslinked, it is left as is thereon. As a consequence, the water soluble resin film is sufficiently formed on the surface of the resist pattern 3, while the water soluble resin film is scarcely or not formed on the surface of the part without the pattern on the support 1. Accordingly, a water soluble resin film (coating film 4) can be formed on the surface of the resist pattern 3 with high coating selectivity.

Furthermore, the coating film 4 which is uniform and has a small film thickness can be provided by washing. More specifically, uncrosslinked excess water soluble resin on the resist pattern 3 is eliminated by washing, while the water soluble resin more strongly bound to the pattern surface through crosslinking is uniformly left on the pattern surface. Therefore, a thin film of the water soluble resin at a nanometer level can be formed with an uniform film thickness and extremely high accuracy, and with high reproducibility.

The cleaning liquid is acceptable as long as it can dissolve and remove uncrosslinked water soluble resin and the like, and for example, similar ones exemplified as solvents for the material for forming a coating film described later can be used.

The washing can be carried out by a known method, and examples of the method include: a method in which the cleaning liquid is supplied by a spraying method on the surface of the painted film constituted with the material for forming a coating film, and thereafter the excess cleaning liquid is aspirated under a reduced pressure; a method of immersion and washing in the cleaning liquid; a method of spraying and washing; a method of washing with steam; a method in which the cleaning liquid is applied on the support with a spin coating method; and the like, and the spin coating method is preferred in particular. Washing conditions (washing time, amount of the cleaning liquid used, and the like) may be predetermined appropriately taking into consideration the washing method and the like. When the washing is carried out by, for example, a spin coating method, the conditions may be adjusted appropriately in the range of approximately 100 to 5,000 rpm for around 1 to 100 sec.

It is preferred that the washing be carried out before complete volatilization of the solvent in the coating film constituted with the material for forming a coating film. Complete or incomplete volatilization of the solvent can be confirmed by visual observation.

The coating film 4 has a thickness of preferably no less than 0.1 nm, more preferably 0.5 to 50 nm, and still more preferably 1 to 30 nm. The thickness of the coating film being no less than 0.1 nm is effective in achieving sufficient resistance and the like to etching, for example, dry etching such as oxygen plasma etching.

[Film Formation Step (2)]

Next, a second chemically amplified resist composition is applied on the support 1 on which multiple coating patterns 5 are formed, and second resist film 6 is formed that fills in the airspace among the multiple coating patterns 5.

In this embodiment, a positive resist composition is used as the second chemically amplified resist composition. When a positive resist composition is used as the first chemically amplified resist composition in the aforementioned film formation step (1), the first chemically amplified resist composition and the second chemically amplified resist composition used may be the same or different.

The second resist film 6 can be formed by a conventionally known method, similarly to the first resist film 2. The second resist film 6 has a film thickness being at least the same as or greater than the height of the coating pattern 5. In other words, the surface of the support 1 is preferably flat when viewed from the side of the second resist film 6.

[Patterning Step (2)]

Subsequently, a site distinct from the site of the second resist film 6 having the multiple coating patterns 5 formed thereon is selectively exposed and developed. Thus, a composite pattern including multiple coating patterns 5 and multiple second resist patterns 7 newly formed on the second resist film 6 is formed on the support 1.

In the present invention, the phrase "a site distinct from the site having a coating pattern formed thereon" refers to all cases except for the case of complete agreement with the coating pattern formed in the coating step, and thus the cases in which there is no overlapping and partial overlapping are involved.

In the present invention, it is preferred that the site having the coating pattern formed thereon does not overlap at all with the site selectively exposed in the patterning step (2). Accordingly, a narrow pitch pattern can be formed having the interval between patterns (pitch) smaller than that of the resist pattern formed in the patterning step (1).

Selective exposure of the site distinct from the site having the coating pattern formed thereon can be carried out by, for example, displacing the mask pattern used in the patterning step (1) in a horizontal direction. Such displacement of the mask pattern can be effected by controlling the program of the exposure device employed. The mask pattern may be displaced horizontally in a single direction, or displaced rotationally. In forming the pattern, for example, after the formation of a line-and-space pattern having multiple lines arranged with a given pitch using a line-and-space mask pattern in the patterning step (1), then in the patterning step (2), the mask pattern is displaced horizontally in a direction perpendicular to the orientation of the line to form a line pattern at an intermediate position of the line patterns formed in the patterning step (1), whereby a line-and-space composite pattern is formed with a pitch being about ½ of the pitch of the line-and-space formed in the first step.

For example, after forming a line-and-space pattern with a line width of 100 nm, and a ratio of line width:space width being 1:3, the mask pattern is horizontally displaced by 200 nm in a direction perpendicular to the orientation of the line to form a line-and-space pattern with a line width of 100 nm, and a ratio of line width:space width being 1:3. Accordingly, a line-and-space pattern with a line width of 100 nm, and a ratio of line width:space width being 1:1 can be formed.

In addition, a variety of composite patterns can be formed either by rotationally displacing the mask used in the patterning step (1), or by using a mask pattern different from the mask pattern used in the patterning step (1).

As a method other than the displacement of the mask pattern, a method in which a stage in the exposure system (table on which the substrate is placed) is displaced may be also employed.

In the method for forming a pattern of the present invention, following the patterning step (2) described above, a second coating step may be further carried out in which a coating film constituted with a water soluble resin film is formed on the surface of the formed composite pattern. Thus, the surface of the second resist pattern 7 formed on the second resist film 6 in the composite pattern is coated with a coating film constituted with a water soluble resin film, whereby etching resistance and the like may be improved.

In the method for forming a pattern of the present invention, a series of the aforementioned operation including the aforementioned coating step, film formation step (2), and patterning step (2) may be further repeated more than once following the patterning step (2) described above. More specifically, an operation of: forming a coating pattern by providing a coating film constituted with a water soluble resin film on the surface of the composite pattern formed; forming a resist film by applying a chemically amplified resist composition on the support 1 having the coating pattern formed thereon; and forming a composite pattern by selectively exposing the resist film, followed by development may be repeated more than once. Thus, formation of a pattern with a further narrower pitch, or formation of a pattern with a complicated shape is enabled.

In the method for forming a pattern of the present invention, after completing the patterning step (2), etching of the support 1 may be carried out using as a mask the formed composite pattern. More specifically, when an organic film is formed on the substrate, etching of the organic film can be carried out, and thus a pattern (organic film pattern) that strictly follows the composite pattern can be formed on the organic film. Furthermore, using these patterns (composite pattern and organic film pattern) as a mask, the substrate can be etched. When the composite pattern is directly formed on the substrate, the etching of the substrate can be carried out using the composite pattern directly as a mask. By etching the substrate in this manner, semiconductor device and the like can be manufactured.

Known methods can be utilized for the etching, and for example, dry etching is preferred when an organic film is etched. Particularly, in light of superior resistance to etching of the coating films, and in light of the production efficiency, oxygen plasma etching, or etching in which a $CF_4$ gas or $CHF_3$ gas is used is preferred. Of these, oxygen plasma etching is preferred. The etching of the substrate is carried out preferably using a halogen gas, more preferably etching using a fluorocarbon based gas, and particularly preferably using a $CF_4$ gas or $CHF_3$ gas.

[Material for Forming Organic Film]

In connection with the support 1 used in the aforementioned film formation step (1), the material for forming an organic film to be used for formation of the organic film which may be formed on the substrate does not necessarily require sensitivity to an electron beam or light as in the case of resist films. Resists and resins commonly used in manufacture of semiconductor elements and liquid crystal display elements may be used.

Also, the material for forming an organic film is preferably a material capable of forming an organic film which can be etched, particularly can be dry etched, such that the organic film pattern can be formed by etching the organic film using a coating pattern coated with the coating film to transfer the coating pattern to the organic film. Of these, a material capable of forming an organic film which can be etched by oxygen plasma etching or the like is preferred.

Such a material for forming an organic film may be a material which has been conventionally used for forming an organic film such as organic BARC. Examples of the material include ARC series manufactured by Brewer Science, Inc., AR series manufactured by Rohm and Haas Co., SWK series manufactured by Tokyo Ohka Kogyo Co., Ltd., and the like.

Among these, when oxygen plasma etching is employed in the etching step, constitution of the organic film with a material which can be readily etched by oxygen plasma etching, and which has comparatively superior resistance to halogen gases, specifically fluorocarbon based gases such as $CF_4$ gas and $CHF_3$ gas is preferred as described above.

In addition, an organic film including at least one resin component selected from the group consisting of a novolak resin, an acrylic resin and soluble polyimide may be formed between the organic BARC and the substrate.

These materials are suitable in the present invention since etching such as oxygen plasma etching can be readily conducted, and they are highly resistant to a fluorocarbon based gas. More specifically, since etching of a substrate is generally carried out using a halogen gas such as a fluorocarbon based gas, constitution of the organic film with such a material enables processibility to be improved with oxygen plasma etching when the organic film pattern is formed, and also enables etching resistance to be improved in the following step in which a halogen gas such as a fluorocarbon based gas that effects etching of the substrate is used, and the like.

These resin components may be used alone, or two or more may be used as a mixture.

Among them, novolak resins, and acrylic resins having an aliphatic cyclic moiety or an aromatic ring on the side chain are preferably used since they have been universally used at low costs, and since they are superior in dry etching resistance conducted using a fluorocarbon gas.

As the novolak resin, any one generally used in positive resist compositions can be used, and positive resists for i-ray or g-ray which contain a novolak resin as a principal component can be also used.

The novolak resin refers to a resin which is obtained by subjecting an aromatic compound having a phenolic hydroxyl group (hereinafter, merely referred to as "phenols") and an aldehyde to addition condensation in the presence of an acid catalyst.

Examples of the phenol include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethyl ether, pyrogallol, phloroglucinol, hydroxydiphenyl, bisphenol A, gallic acid, gallic acid ester, α-naphthol, β-naphthol, and the like.

Examples of the aldehydes include formaldehyde, furfural, benzaldehyde, nitrobenzaldehyde, acetaldehyde, and the like.

The catalyst used in the addition condensation reaction is not particularly limited, and for example, hydrochloric acid, nitric acid, sulfuric acid, formic acid, oxalic acid, acetic acid or the like may be used as the acid catalyst.

As the novolak resin, commercially available products can be also used.

Novolak resin has a mass-average molecular weight (Mw) with a lower limit of preferably no less than 3,000, more preferably no less than 5,000, further preferably no less than 6,000, and still more preferably no less than 7,000. The upper limit value is preferably no greater than 50,000, more preferably no greater than 30,000, further preferably no greater than 10,000, and most preferably no greater than 9,000.

When the Mw is no less than 3,000, sublimation is less likely to occur in baking at a high temperature, leading to reduction of possibility of fouling of the device. In addition, a Mw of no less than 5,000 is preferred since superior etching resistance to fluorocarbon based gas and the like is provided. Moreover, a Mw of no greater than 50,000 is preferred since favorable embedding characteristics into the substrate having a fine relief structure are achieved. When the Mw is no greater than 10,000 in particular, the dry etching is likely to be more readily executed.

As the novolak resin, those having, in particular, Mw of 5,000 to 50,000, and preferably 8,000 to 30,000, and including a low-molecular weight component having a molecular weight of no greater than 500, and preferably no greater than 200 at a content of no greater than 1% by mass, and preferably no greater than 0.8% by mass determined on gel permeation chromatography are preferred. The content of the low-molecular weight component is preferably as low as possible, and is desirably 0% by mass.

By defining the content of the low-molecular weight component having a molecular weight of no greater than 500 to be no greater than 1% by mass, favorable embedding characteristics into the substrate having a fine relief structure are exhibited. Although the grounds for the favorable embedding characteristics exhibited by reducing the content of the low-molecular weight component are not clear, it is assumed to result from a lowered degree of dispersion.

The "low-molecular weight component having a molecular weight of no greater than 500" herein is detected as a low-molecular fraction with a molecular weight of 500 or less when analyzed by a GPC method using polystyrene standards. The "low-molecular weight component having a molecular weight of no greater than 500" may include unpolymerized monomers, poorly polymerized products, for example, condensation products of aldehydes with two to five molecules of phenols, which may vary depending on the molecular weight, and the like.

The content (% by mass) of the low-molecular weight component having a molecular weight of no greater than 500 is determined by plotting fraction numbers (along the abscissa) versus concentrations (along the ordinate) of the analysis results obtained by the GPC method to draw a graph, and deriving the ratio (%) of the area under the curve in the range of the low-molecular weight fraction covering a molecular weight of no greater than 500 to the entire area under the curve.

As the acrylic resin, any one generally used in positive resist compositions can be used, and for example, acrylic resins including a constitutional unit derived from a polymerizable compound having an ether linkage, and a constitutional unit derived from a polymerizable compound having a carboxy group can be exemplified.

Illustrative examples of the polymerizable compound having an ether linkage include (meth)acrylic acid derivatives having an ether linkage and an ester linkage such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate and tetrahydrofurfuryl (meth)acrylate, and the like. These compounds may be used alone, or in combination of two or more thereof. The term "(meth)acrylate" herein refers to either one or both of acrylate and methacrylate.

Illustrative examples of the polymerizable compound having a carboxy group include: monocarboxylic acids such as acrylic acid, methacrylic acid and crotonic acid; dicarboxylic acids such as maleic acid, fumaric acid and itaconic acid; and compounds having a carboxy group and an ester linkage such as 2-methacryloyloxyethylsuccinic acid, 2-methacryloyloxyethylmaleic acid, 2-methacryloyloxyethylphthalic acid, 2-methacryloyloxyethylhexahydrophthalic acid; and the like. Preferably, the polymerizable compound having a carboxy group is acrylic acid, and methacrylic acid. These compounds may be used alone, or in combination of two or more thereof.

The soluble polyimide is a polyimide that can be liquified with an organic solvent.

The material for forming an organic film may further appropriately contain if desired, additives having miscibility, such as for example, an additional resin for improving the characteristics of the organic film, a surfactant for improving application abilities, a dissolution-preventing agent, a plasticizer, a stabilizer, a colorant, a halation inhibitor, and the like.

The material for forming an organic film may be prepared by dissolving the aforementioned materials such as a resin component and the like in an organic solvent. As the organic solvent, similar ones exemplified as the component (S) of the chemically amplified resist composition described above can be used.

Also, a hard mask layer constituted with a silicon-based material may be provided between the resist film and the organic film.

Material for Forming Coating Film

The material for forming a coating film of the present invention is constituted with an aqueous solution that contains a water soluble resin and a water soluble crosslinking agent, and is used for forming the coating film in the method for forming a pattern of the present invention described above.

Water Soluble Resin

The water soluble resin is not particularly limited as long as it is a resin which can be dissolved in water at a room temperature, and is preferably constituted to include at least one selected from an acrylic resin, a vinyl based resin, a cellulose based resin and an amide based resin, in the present invention.

Examples of the acrylic resin include polymers or copolymers constituted with a monomer such as acrylic acid, methyl acrylate, methacrylic acid, methyl methacrylate, N,N-dimethylacrylamide, N,N-dimethylaminopropylmethacrylamide, N,N-dimethylaminopropylacrylamide, N-methylacrylamide, diacetoneacrylamide, N,N-dimethylaminoethyl methacrylate, N,N-diethylaminoethyl methacrylate, N,N-dimethylaminoethyl acrylate, acryloyl morpholine and the like.

Examples of the vinyl based resin include polymers or copolymers constituted with a monomer such as N-vinylpyrrolidone, vinylimidazolidinone, vinyl acetate or the like.

Examples of the cellulose based resin include hydroxypropyl methylcellulose phthalate, hydroxypropyl methylcellulose acetate phthalate, hydroxypropyl methylcellulose hexahydrophthalate, hydroxypropyl methylcellulose acetate succinate, hydroxypropyl methylcellulose, hydroxypropyl cellulose, hydroxyethyl cellulose, cellulose acetate hexahydrophthalate, carboxymethyl cellulose, ethyl cellulose, methyl cellulose, and the like.

Furthermore, among amide based resins, those which are soluble in water can be also used.

Of these examples, vinyl based resins are preferred, and particularly polyvinylpyrrolidone and polyvinyl alcohol are preferred.

These water soluble resins may be used alone, or two or more thereof may be used as a mixture. In order to provide the coating film having a film thickness that is necessary and sufficient for use, the amount of the water soluble resin included is preferably about 1 to 99% by mass, more preferably about 40 to 99% by mass, and still more preferably about 65 to 99% by mass in the solid content of the material for forming a coating film.

Water Soluble Crosslinking Agent

The water soluble crosslinking agent has at least one nitrogen atom in the structure thereof. As such a water soluble crosslinking agent, a nitrogen-containing compound having an amino group and/or imino group in which at least two hydrogen atoms are substituted with a hydroxyalkyl group and/or alkoxyalkyl group is preferably used. Examples of such nitrogen-containing compounds include melamine based derivatives, urea based derivatives, guanamine based derivatives, acetoguanamine based derivatives, benzoguanamine based derivatives and succinyl amide based derivatives in which the hydrogen atom of the amino group is substituted with a methylol group or an alkoxymethyl group or both of these, as well as glycoluril based derivatives and ethylene urea based derivatives in which the hydrogen atom of the imino group is substituted, and the like.

Among these nitrogen-containing compounds, at least one or more of: triazine derivatives such as benzoguanamine based derivatives, guanamine based derivatives, and melamine based derivatives; glycoluril based derivatives; and urea based derivatives, which have an amino group or an imino group in which at least two hydrogen atoms are substituted with a methylol group or a (lower alkoxy)methyl group, or both of these, are preferred in light of the crosslinking reactivity.

The amount of the water soluble crosslinking agent included is preferably about 1 to 99% by mass, more preferably about 1 to 60% by mass, and still more preferably 1 to 35% by mass the solid content of the material for forming a coating film.

Solvent

The material for forming a coating film of the present invention is usually used in the form of an aqueous solution that contains the water soluble resin and the water soluble crosslinking agent. This material for forming a coating film is preferably used in the form of an aqueous solution having a concentration of 3 to 50% by mass, and more preferably used in the form of an aqueous solution having a concentration of 5 to 20% by mass. When the concentration is less than 3% by mass, failure in coating the resist pattern may result, while a concentration exceeding 50% by mass is not preferred since improvement of effects appropriately corresponding to the increased concentration cannot be found, and also in view of the handleability.

Furthermore, a mixed solvent including water and an alcoholic solvent may be also used as the solvent. Examples of the alcoholic solvent include methyl alcohol, ethyl alcohol, propyl alcohol, isopropyl alcohol, glycerin, ethylene glycol, propylene glycol, 1,2-butylene glycol, 1,3-butylene glycol, 2,3-butylene glycol, and the like. These alcoholic solvents may be used as a mixture with water in a proportion up to 30% by mass.

Optional Component

An optional component may be blended into the material for forming a coating film as follows, in addition to the water soluble resin and the water soluble crosslinking agent.

Surfactant

A surfactant, for example, may be blended into the material for forming a coating film. Although the surfactant is not particularly limited, characteristics such as high solubility in the aforementioned water soluble resin, and preclusion of development of suspension, and the like are required. Use of such a surfactant that complies with these characteristics can suppress generation of air bubble (microfoam), especially when applying the material for forming a coating film, thereby enabling prevention of defect generation reportedly related to the microfoam generation. In view of the foregoing aspects, one or more of an N-alkylpyrrolidone based surfactant, a quaternary ammonium salt based surfactant, a surfactant based on a phosphoric acid ester of polyoxyethylene, and a nonium based surfactant may be preferably used.

As the N-alkylpyrrolidone based surfactant, a compound represented by the following general formula (13) is preferred.

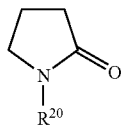
(13)

In the formula (13), $R^{20}$ represents an alkyl group having 6 or more carbon atoms.

Specific examples of such an N-alkylpyrrolidone based surfactant include N-hexyl-2-pyrrolidone, N-heptyl-2-pyrrolidone, N-octyl-2-pyrrolidone, N-nonyl-2-pyrrolidone, N-decyl-2-pyrrolidone, N-decyl-2-pyrrolidone, N-undecyl-2-pyrrolidone, N-dodecyl-2-pyrrolidone, N-tridecyl-2-pyrrolidone, N-tetradecyl-2-pyrrolidone, N-pentadecyl-2-pyrrolidone, N-hexadecyl-2-pyrrolidone, N-heptadecyl-2-pyrrolidone, N-octadecyl-2-pyrrolidone, and the like. Among these, N-octyl-2-pyrrolidone ("SURFADONELP 100"; manufactured by ISP) is preferably used.

As the quaternary ammonium based surfactant, a compound represented by the following general formula (14) is preferred.

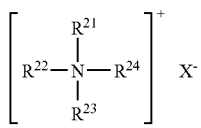
(14)

In the formula (14), $R^{21}$, $R^{22}$, $R^{23}$ and $R^{24}$ each independently represent an alkyl group or a hydroxyalkyl group (wherein, at least one thereof represents an alkyl group or a hydroxyalkyl group having 6 or more carbon atoms), and $X^-$ represents a hydroxide ion or a halogen ion.

Specific examples of the quaternary ammonium based surfactant include dodecyltrimethylammonium hydroxide, tridecyltrimethylammonium hydroxide, tetradecyltrimethylammonium hydroxide, pentadecyltrimethylammonium hydroxide, hexadecyltrimethylammonium hydroxide, heptadecyltrimethylammonium hydroxide, octadecyltrimethylammonium hydroxide, and the like. Among these, hexadecyltrimethylammonium hydroxide is preferably used.

As the surfactant based on a phosphoric acid ester of polyoxyethylene, a compound represented by the following general formula (15) is preferred.

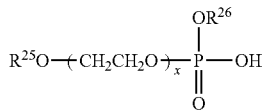
(15)

In the formula (15), $R^{25}$ represents an alkyl group or an alkylallyl group having 1 to 10 carbon atoms; $R^{26}$ represents a hydrogen atom or $(CH_2CH_2O)R^{25}$ (wherein $R^{25}$ is as defined above); and x represents an integer of 1 to 20.

Specifically, as such a surfactant based on a phosphoric acid ester of polyoxyethylene, commercially available products such as "Plysurf A212E" and "Plysurf A210G" (both manufactured by Dai-ichi Kogyo Seiyaku Co., Ltd.) can be preferably used.

The nonionic surfactant is preferably an alkyl etherified product of polyoxyalkylene, or an alkylamine oxide compound.

As the alkyl etherified product of polyoxyalkylene, a compound represented by the following general formula (16) or (17) is preferably used.

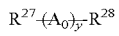
(16)

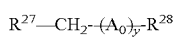
(17)

In the general formulae (16) and (17), $R^{27}$ and $R^{28}$ represent a linear, branched or cyclic alkyl group, an alkyl group having a hydroxyl group, or an alkylphenyl group having 1 to 22 carbon atoms. $A_O$ represents an oxyalkylene group, and is preferably at least one selected from oxyethylene, oxypropylene and oxybutylene groups. y is an integer.

As the alkylamine oxide compound, a compound represented by the following general formula (18) or (19) is preferably used.

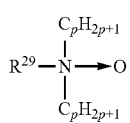
(18)

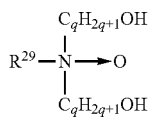
(19)

In the general formulae (18) and (19), $R^{29}$ represents an alkyl group or a hydroxyalkyl group having 8 to 20 carbon atoms which may be interrupted with an oxygen atom, and p and q represent an integer of 1 to 5.

Examples of the alkylamine oxide compound represented by the above general formulae (18) and (19) include octyldimethylamine oxide, dodecyldimethylamine oxide, decyldimethylamine oxide, lauryldimethylamine oxide, cetyldimethylamine oxide, stearyldimethylamine oxide, isohexyldiethylamine oxide, nonyldiethylamine oxide, lauryldiethylamine oxide, isopentadecylmethylethylamine oxide, stearylmethylpropylamine oxide, lauryldi(hydroxyethyl)amine oxide, cetyldiethanolamine oxide, stearyldi(hydroxyethyl)amine oxide, dodecyloxyethoxyethyldi(methyl)amine oxide, stearyloxyethyldi(methyl)amine oxide, and the like.

Among these surfactants, a nonium based surfactant is preferably used in light of reduction of defects, in particular.

The amount of the surfactant included is preferably about 0.1 to 10% by mass, and more preferably about 0.2 to 2% by mass in the solid content of the material for forming a coating film. When the amount does not fall within the above range, problems such as deterioration of the application abilities, or generation of defect which is believed to be significantly associated with bubble, which may be referred to as microfoam, that is generated during application may result.

Water Soluble Fluorine Compound

A water soluble fluorine compound may be blended into the material for forming a coating film. Although the water soluble fluorine compound is not particularly limited, characteristics such as high solubility in the aforementioned water soluble resin, and preclusion of development of suspension, and the like are required. Use of a water soluble fluorine compound that complies with such characteristics can improve a leveling property (extent of spreading of the material for forming a coating film). Although this leveling property can be achieved by lowering of the contact angle by adding a surfactant, when the amount of addition of the surfactant is in excess, an improving ability for application at a certain level or higher cannot be achieved, but by adding in an excess amount, the bubble (microfoam) may be generated on the coating film depending on the application conditions, thereby leading to a problem of potentially causing defects. By blending this water soluble fluorine compound, the contact angle is lowered while suppressing such foaming, and thus leveling properties can be improved.

As the water soluble fluorine compound, fluoroalkyl alcohols, fluoroalkylcarboxylic acids and the like are preferably used. Examples of the fluoroalkyl alcohols include 2-fluoro-1-ethanol, 2,2-difluoro-1-ethanol, trifluoroethanol, tetrafluoropropanol, octafluoroamyl alcohol, and the like. Examples of the fluoroalkylcarboxylic acids include trifluoroacetic acid, and the like. However, the fluoroalkylcarboxylic acid is not limited to such exemplified compounds, and is acceptable as long as it is a fluorine compound having water solubility, and exhibits the effects described above. In particular, fluoroalkyl alcohols having 6 or less carbon atoms may be preferably used. Among these, in light of ready availability and the like, trifluoroethanol is particularly preferred.

The amount of the water soluble fluorine compound included is preferably about 0.1 to 30% by mass, and more preferably about 0.1 to 15% by mass in the solid content of the material for forming a coating film. When the amount of blending is below the above range, application abilities may be deteriorated. When the compound is included in an amount exceeding the aforementioned upper limit, improvement of the leveling properties to meet such an amount of blending cannot be expected.

Amide Group-Containing Monomer

An amide group-containing monomer may be blended into the material for forming a coating film. Although the amide group-containing monomer is not particularly limited, characteristics such as high solubility in the aforementioned water soluble resin, and preclusion of development of suspension, and the like are required.

As the amide group-containing monomer, the amide compound represented by the following general formula (20) is preferably used.

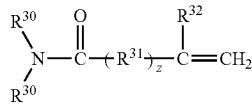

(20)

In the above general formula (20), $R^{30}$ represents a hydrogen atom, an alkyl group or a hydroxyalkyl group having 1 to 5 carbon atoms; $R^{31}$ represents an alkyl group having 1 to 5 carbon atoms; $R^{32}$ represents a hydrogen atom or a methyl group; and z represents an integer of 0 to 5. In the foregoing, the alkyl group, and the hydroxyalkyl group may be either linear, or branched.

In the general formula (20), an amide group-containing monomer in which $R^{30}$ represents a hydrogen atom, a methyl group, or an ethyl group; and z represents 0 is more preferably used. Specific examples of the amide group-containing monomer include acrylamide, methacrylamide, N,N-dimethylacrylamide, N,N-dimethylmethacrylamide, N,N-diethylacrylamide, N,N-diethylmethacrylamide, N-methylacrylamide, N-methylmethacrylamide, N-ethylacrylamide, N-ethylmethacrylamide, and the like. Among these, and acrylamide, methacrylamide are particularly preferred.

The amide group-containing monomer included is preferably about 0.1 to 30% by mass, and more preferably about 1 to 15% by mass in the solid content of the material for forming a coating film. When the amount is less than 0.1% by mass, desired effects are hardly achieved. Meanwhile even though the amount is beyond 30% by mass, an additional effect in response to the amount blended is not achieved.

Heterocyclic Compound Having at Least Oxygen Atom and/or Nitrogen Atom

A heterocyclic compound having at least an oxygen atom and/or nitrogen atom may be blended into the material for forming a coating film.

As the heterocyclic compound, at least one selected from a compound having an oxazolidine skeleton, a compound having an oxazoline skeleton, a compound having an oxazolidone skeleton, and a compound having an oxazolidinone skeleton is preferably used.

Examples of the compound having an oxazolidine skeleton include oxazoline represented by the following formula (21), as well as substituted products thereof.

(21)

Examples of the substituted product include compounds having substitution of a hydrogen atom bound to the carbon atom or nitrogen atom of oxazoline represented by the above formula (21), with a substituted or unsubstituted lower alkyl group having 1 to 6 carbon atoms, a carboxyl group, a hydroxyl group, or a halogen atom. As the substituted lower alkyl group, a hydroxyalkyl group, a (lower alkoxy)alkyl group, and the like may be exemplified, but not limited thereto.

Examples of the compound having an oxazoline skeleton include 2-oxazoline represented by the following formula (22-1), 3-oxazoline represented by the following formula (22-2), 4-oxazoline represented by the following formula (22-3), as well as substituted products thereof.

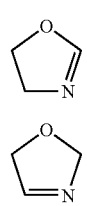

(22-1)

(22-2)

-continued

(22-3)

Examples of the substituted product include compounds having substitution of a hydrogen atom bound to the carbon atom or nitrogen atom of a compound having an oxazoline skeleton represented by the above formulae (22-1) to (22-3), with a substituted or unsubstituted lower alkyl group having 1 to 6 carbon atoms, a carboxyl group, a hydroxyl group, or a halogen atom. As the substituted lower alkyl group, a hydroxyalkyl group, a (lower alkoxy)alkyl group, and the like may be exemplified, but not limited thereto.

Among the compounds having an oxazoline skeleton, 2-methyl-2-oxazoline represented by the following formula (22-1-A) is preferably used.

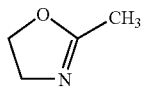
(22-1-A)

Examples of the compound having an oxazolidone skeleton include 5(4)-oxazolone represented by the following formula (23-1), 5(2)-oxazolone represented by the following formula (23-2), 4(5)-oxazolone represented by the following formula (23-3), 2(5)-oxazolone represented by the following formula (23-4), 2(3)-oxazolone represented by the following formula (23-5), as well as substituted products thereof.

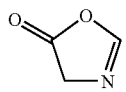
(23-1)

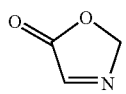
(23-2)

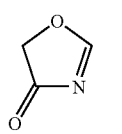
(23-3)

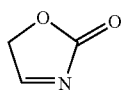
(23-4)

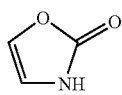
(23-5)

Examples of the substituted product include compounds having substitution of a hydrogen atom bound to the carbon atom or nitrogen atom of a compound having an oxazoline skeleton represented by the above formulae (23-1) to (23-5), with a substituted or unsubstituted lower alkyl group having 1 to 6 carbon atoms, a carboxyl group, a hydroxyl group, or a halogen atom. As the substituted lower alkyl group, a hydroxyalkyl group, a (lower alkoxy)alkyl group, and the like may be exemplified, but not limited thereto.

Examples of the compound having an oxazolidinone skeleton (or compound having a 2-oxazolidone skeleton) include oxazolidinone (or 2-oxazolidone) represented by the following formula (24), as well as substituted products thereof.

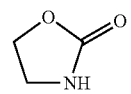
(24)

Examples of the substituted product include compounds having substitution of a hydrogen atom bound to the carbon atom or nitrogen atom of oxazolidinone (or 2-oxazolidone) represented by the above formula (24), with a substituted or unsubstituted lower alkyl group having 1 to 6 carbon atoms, a carboxyl group, a hydroxyl group, or a halogen group. As the substituted lower alkyl group, a hydroxyalkyl group, a (lower alkoxy)alkyl group, and the like may be exemplified, but not limited thereto.

Among the compounds having an oxazolidinone skeleton, 3-methyl-2-oxazolidone represented by the following formula (24-1) is preferably used.

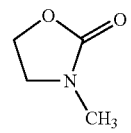
(24-1)

The amount of the heterocyclic compound having at least an oxygen atom and/or nitrogen atom blended is preferably 1 to 50% by mass, and more preferably 3 to 20% by mass based on the mass of the water soluble resin. When the amount is less than 1% by mass, desired effects are hardly achieved. Meanwhile, even though the amount is beyond 50% by mass, the effect is not improved to meet the amount of blending.

Heterocyclic Compound Having Two or More Nitrogen Atoms in At Least the Identical Ring A heterocyclic compound having two or more nitrogen atoms in at least the identical ring may be blended into the material for forming a coating film.

Examples of the heterocyclic compound include pyrazole based compounds such as pyrazole, 3,5-dimethyl pyrazole, 2-pyrazoline, 5-pyrazolone, 3-methyl-1-phenyl-5-pyrazolone, 2,3-dimethyl-1-phenyl-5-pyrazolone, 2,3-dimethyl-4-dimethylamino-1-phenyl-5-pyrazolone, and benzopyrazole; imidazole based compounds such as imidazole, methylimidazole, 2,4,5-triphenylimidazole, 4-(2-aminoethyl)imidazole, and 2-amino-3-(4-imidazolyl)propionic acid; imidazoline based compounds such as 2-imidazoline, 2,4,5-triphenyl-2-imidazoline, and 2-(1-naphthylmethyl)-2-imidazoline; imidazolidine based compounds such as imidazolidine, 2-imidazolidone, 2,4-imidazolidinedione, 1-methyl-2,4-imidazolidinedione, 5-methyl-2,4-imidazolidinedione, 5-hydroxy-2,4-imidazolidinedione-5-carboxylic acid, 5-ureide-2,4-imidazolidinedione, 2-imino-1-methyl-4-imidazolidone, and 2-thioxo-4-imidazolidone; benzimidazole based compounds such as benzimidazole, 2-phenylbenzimidazole, and 2-benzimidazolinone; diazine based compounds such as 1,2-diazine, 1,3-diazine, 1,4-diazine, and 2,5-dimethylpyrazine; hydropyrimidine based compounds such as 2,4(1H,3H) pyrimidinedione, 5-methyluracil, 5-ethyl-5-phenyl-4,6-perhydropyrimidinedione, 2-thioxo-4(1H,3H)-pyrimidinone, 4-imino-2(1H,3H)-pyrimidine, and 2,4,6(1H,3H,5H)-pyrimidine trione; benzodiazine based compounds such as cinnoline, phthalazine, quinazoline, quinoxaline, and luminol; dibenzodiazine based compounds such as benzocinoline, phenazine, and 5,10-dihydrophenazine; triazole based compounds such as 1H-1,2,3-triazole, 1H-1,2,4-triazole, and 4-amino-1,2,4-triazole; benzotriazole based compounds such as benzotriazole, and 5-methylbenzotriazole; triazine based compounds such as 1,3,5-triazine, 1,3,5-triazine-2,4,6-triol, 2,4,6-trimethoxy-1,3,5-triazine, 1,3,5-triazine-2,4,6-trithiol, 1,3,5-triazine-2,4,6-triamine, and 4,6-diamino-1,3,5-triazine-2-ol; and the like, but not limited thereto.

Among these, in light of ease in handling, ready availability, and the like, a monomer of an imidazole based compound is preferably used, and particularly imidazole is preferably used.

The amount of the heterocyclic compound having two or more nitrogen atoms in at least the identical ring blended is preferably about 1 to 15% by mass, and more preferably about 2 to 10% by mass based on the mass of the water soluble resin. When the amount is less than 1% by mass, desired effects are hardly achieved, while desired effects are also hardly achieved when the amount is beyond 15% by mass, and further risk of generation of defects is increased.

Water Soluble Amine Compound

A water soluble amine compound may be blended into the material for forming a coating film. Use of such a water soluble amine compound enables the prevention of the generation of impurities, and adjustment of the pH, and the like.

Examples of the water soluble amine compound include amines having a pKa (acid dissociation constant) in an aqueous solution at 25° C. of 7.5 to 13. Specific examples of the amines include: alkanolamines such as monoethanolamine, diethanolamine, triethanolamine, 2-(2-aminoethoxy)ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine, and triisopropanolamine; polyalkylenepolyamines such as diethylenetriamine, triethylenetetramine, propylenediamine, N,N-diethylethylenediamine, 1,4-butanediamine, N-ethylethylenediamine, 1,2-propanediamine, 1,3-propanediamine, and 1,6-hexanediamine; aliphatic amines such as 2-ethyl-hexylamine, dioctylamine, tributylamine, tripropylamine, triallylamine, heptylamine, and cyclohexylamine; aromatic amines such as benzylamine, and diphenylamine; cyclic amines such as piperazine, N-methyl-piperazine, and hydroxyethylpiperazine; and the like. Among these, amines having a boiling point of no less than 140° C. (760 mmHg) are preferred, and for example, monoethanolamine, triethanolamine or the like may be preferably used.

The water soluble amine compound included is preferably about 0.1 to 30% by mass, and more preferably about 2 to 15% by mass in the solid content of the material for forming a coating film. When the amount is less than 0.1% by mass, time dependent deterioration of the liquid may result. In contrast, when the amount exceeds 30% by mass, impairment of the shape of the resist pattern may result.

Nonamine Based Water Soluble Organic Solvent

A nonamine based water soluble organic solvent may be blended into the material for forming a coating film. Use of such a nonamine based water soluble organic solvent enables generation of the defect to be suppressed.

As the nonamine based water soluble organic solvent, a nonamine based organic solvent that is miscible with water is acceptable, and examples thereof include: sulfoxides such as dimethyl sulfoxide; sulfones such as dimethyl sulfone, diethyl sulfone, bis(2-hydroxyethyl) sulfone, and tetramethylene sulfone; amides such as N,N-dimethylformamide, N-methylformamide, N,N-dimethylacetamide, N-methylacetamide, and N,N-diethylacetamide; lactams such as N-methyl-2-pyrrolidone, N-ethyl-2-pyrrolidone, N-propyl-2-pyrrolidone, N-hydroxymethyl-2-pyrrolidone, and N-hydroxyethyl-2-pyrrolidone; imidazolidinones such as 1,3-dimethyl-2-imidazolidinone, 1,3-diethyl-2-imidazolidinone, and 1,3-diisopropyl-2-imidazolidinone; polyhydric alcohols such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, diethylene glycol monobutyl ether, propylene glycol, propylene glycol monomethyl ether, glycerin, 1,2-butylene glycol, 1,3-butylene glycol, and 2,3-butylene glycol; and derivatives thereof. Among these, in light of suppression of the generation of the defect, and the like, polyhydric alcohols and derivatives thereof may be preferably used, and particularly glycerin is preferably used. The nonamine based water soluble organic solvent may be used alone, or two or more of them may be used.

The amount of the nonamine based water soluble organic solvent blended is preferably about 0.1 to 30% by mass, and more preferably about 0.5 to 15% by mass based on the water soluble resin. When the amount is less than 0.1% by mass, the effect of decreasing the defect is likely to deteriorate. In contrast, when the amount exceeding 30% by mass is not preferred since a mixing layer with the resist pattern is likely to be formed.

EXAMPLES

Hereinafter, the present invention is explained in more detail by way of Examples, but the present invention is not any how limited to these Examples.

Example 1

An ArF resist composition "TArF-P6111" (manufactured by Tokyo Ohka Kogyo Co., Ltd.) was applied by spin coating on an 8-inch silicon substrate, and subjected to a prebaking treatment (PAB) under a condition of 140° C. for 60 sec, whereby a resist film having a film thickness of 243 nm was formed. Next, this resist film was selectively exposed using a KrF excimer laser exposure device NSR-S203 (manufactured by Nikon Corporation, NA=0.68, σ=0.75) through a mask with a line width of 250 nm, and a pitch of 750 nm. Subsequently, a baking treatment (PEB) was carried out under a condition of 140° C. for 60 sec, followed by development using a 2.38% by mass aqueous tetramethylammonium hydroxide solution for 30 sec, and washing with deionized water for 20 sec. As a result, a resist pattern including line patterns having a line width of 270 nm arranged on the resist film at regular intervals (hereinafter, referred to as pattern (1)) was formed.

Separately, an aqueous solution including polyvinylpyrrolidone "PVPK30" (manufactured by BASF Ltd.) as a water soluble resin, a urea based crosslinking agent "N-8314" (manufactured by SANWA Chemical Co., Ltd) as a water soluble crosslinking agent in an amount of 5% by mass based on the water soluble resin, and 500 ppm of lauryldimethylamine oxide as a surfactant based on the total amount (total solid content=10% by mass) was prepared as a material for forming a coating film.

This material for forming a coating film was applied uniformly on the pattern (1) by spin coating, and thereafter subjected to a baking treatment under a condition of 130° C. for 60 sec, followed by washing with deionized water for 60 sec. As a result, the surface of the pattern (1) was covered by a uniform coating film (water soluble resin film), and a coating line pattern was formed.

Subsequently, propylene glycol monomethyl ether acetate (hereinafter, also referred to as "PGMEA") that is a solvent for the resist was spin coated on the substrate having the coating line pattern formed thereon, which was subjected to a drying treatment at 140° C. for 60 sec. Thereafter, the entire face of the resist film was exposed without a mask, and then developed under the same condition as described above, followed by washing with deionized water for 20 sec. As a result, no alteration of the coating line pattern size was observed.

From the result described above, it was ascertained that use of the material for forming a coating film of the present invention can be expected to result in the coating line pattern to keep its shape identical to that before applying the resist composition thereon without being accompanied by dissolution, even after carrying out the second patterning.

Example 2

A resistance test against the resist was carried out in a completely similar manner to that in Example 1 except that the material for forming a coating film used in Example 1 described above was changed to an aqueous solution including polyvinylpyrrolidone "PVPK30" (manufactured by BASF Ltd.) as a water soluble resin, an ethylene urea based crosslinking agent "N-1951" (manufactured by SANWA Chemical Co., Ltd) as a water soluble crosslinking agent in an amount of 5% by mass based on the water soluble resin, and 500 ppm of lauryldimethylamine oxide as a surfactant based on the total amount (total solid content=10% by mass). As a result, no alteration of the coating line pattern size was observed, and it was ascertained that the coating line pattern can be expected to keep its shape identical to that before applying the resist composition thereon without being accompanied by dissolution, similarly to Example 1.

Example 3

A resistance test against the resist was carried out in a completely similar manner to that in Example 1 except that the material for forming a coating film used in Example 1 described above was changed to an aqueous solution including polyvinylpyrrolidone "PVPK30" (manufactured by BASF Ltd.) as a water soluble resin, a melamine based crosslinking agent "Hw30HM" (manufactured by SANWA Chemical Co., Ltd) as a water soluble crosslinking agent in an amount of 5% by mass based on the water soluble resin, and 500 ppm of lauryldimethylamine oxide as a surfactant based on the total amount (total solid content=10% by mass). As a result, no alteration of the coating line pattern size was observed, and it was ascertained that the coating line pattern can be expected to keep its shape identical to that before applying the resist composition thereon without being accompanied by dissolution, similarly to Example 1.

Example 4

An ArF resist composition "TArF-P6111" (manufactured by Tokyo Ohka Kogyo Co., Ltd.) was applied by spin coating on an 8-inch silicon substrate, and subjected to a prebaking treatment (PAB) under a condition of 140° C. for 60 sec, whereby a resist film having a film thickness of 243 nm was formed. Next, this resist film was selectively exposed using a KrF excimer laser exposure system NSR-S203 (manufactured by Nikon Corporation, NA=0.68, σ=0.75) through a mask with a line width of 250 nm, and a pitch of 750 nm. Subsequently, a baking treatment (PEB) was carried out under a condition of 140° C. for 60 sec, followed by development using a 2.38% by mass aqueous tetramethylammonium hydroxide solution for 30 sec, and washing with deionized water for 20 sec. As a result, a resist pattern including line patterns having a line width of 270 nm arranged on the resist film at regular intervals (hereinafter, referred to as pattern (1)) was formed.

Separately, an aqueous solution including polyvinylpyrrolidone "PVPK30" (manufactured by BASF Ltd.) as a water soluble resin, a urea based crosslinking agent "N-8314" (manufactured by SANWA Chemical Co., Ltd) as a water soluble crosslinking agent in an amount of 5% by mass based on the water soluble resin, and lauryldimethylamine oxide as a surfactant in an amount of 0.5% by mass based on the total amount (total solid content=10% by mass) was prepared as a material for forming a coating film.

This material for forming a coating film was applied uniformly on the pattern (1) by spin coating, and thereafter subjected to a baking treatment under a condition of 130° C. for 60 sec, followed by washing with deionized water for 60 sec. As a result, the surface of the pattern (1) was covered by a uniform coating film (water soluble resin film), and a coating line pattern was formed.

Subsequently, the aforementioned resist composition was applied again on the substrate having the coating line pattern formed thereon under the conditions identical to those described above, and subjected to a prebaking treatment, whereby a resist film was formed. The entire face of the resist film was exposed without a mask, and thereafter developed under the same condition as that described above, followed by washing with deionized water for 20 sec. As a result, no alteration of the shape and size of the coating line pattern was observed.

From the results described above, it was ascertained that use of the material for forming a coating film of the present invention can be expected to result in the coating line pattern to keep its shape identical to that before applying the resist composition thereon without being accompanied by dissolution, even after forming the second resist film, and carrying out the exposure and development.

Example 5

A resistance test against the resist was carried out in a completely similar manner to that in Example 4 except that the material for forming a coating film used in Example 4 described above was changed to an aqueous solution including polyvinylpyrrolidone "VA64W" (manufactured by BASF Ltd.) as a water soluble resin, a urea based crosslinking agent "N-8314" (manufactured by SANWA Chemical Co., Ltd) as a water soluble crosslinking agent in an amount of 20% by mass based on the water soluble resin, and 500 ppm of lauryldimethylamine oxide as a surfactant based on the total amount (total solid content=10% by mass). As a result, no alteration of the shape and size of the coating line pattern was observed, and it was ascertained that the coating line pattern can be expected to keep its shape identical to that before applying the resist composition thereon without being accompanied by dissolution, similarly to Example 1.

Example 6

A resistance test against the resist was carried out in a completely similar manner to that in Example 4 except that the material for forming a coating film used in Example 4 described above was changed to an aqueous solution including polyvinyl alcohol as a water soluble resin, and a urea based crosslinking agent "N-8314" (manufactured by SANWA Chemical Co., Ltd) as a water soluble crosslinking agent in an amount of 10% by mass based on the water soluble resin (total solid content=5% by mass). As a result, no alteration of the shape and size of the coating line pattern was observed, and it was ascertained that the coating line pattern can be expected to keep its shape identical to that before applying the resist composition thereon without being accompanied by dissolution, similarly to Example 1.

Comparative Example 1

Formation of a resist pattern, and a resistant test against the resist composition were carried out by similar procedures to those in Example 4 described above except that the material for forming a coating film was not used. As a result, the first resist pattern completely disappeared from on the substrate.

The invention claimed is:

1. A method for forming a pattern wherein a pattern is formed using a chemically amplified resist composition, the method comprising the steps of:
    forming a first resist film by applying a first chemically amplified resist composition on a support;
    forming a first resist pattern by selectively exposing the first resist film through a first mask pattern followed by development;
    forming a coating pattern by forming a coating film constituted with a water soluble resin film on the surface of the first resist pattern;
    forming a second resist film by applying a second chemically amplified resist composition on the support having the coating pattern formed thereon; and
    forming a second resist pattern by selectively exposing the second resist film through a second mask pattern followed by development.

2. The method for forming a pattern according to claim 1 wherein the coating film is formed using a material for forming a coating film, and wherein the material is constituted with an aqueous solution comprising a water soluble resin and a water soluble crosslinking agent.

3. The method for forming a pattern according to claim 2 wherein the water soluble resin is at least one of an acrylic resin, a vinyl based resin, a cellulose based resin, and an amide based resin.

4. The method for forming a pattern according to claim 2 wherein the water soluble resin is at least one of polyvinylpyrrolidone and polyvinyl alcohol.

5. The method for forming a pattern according to claim 2 wherein the water soluble crosslinking agent is at least one of a triazine derivative, a glycoluril derivative, and a urine derivative.

* * * * *